United States Patent
Hsieh et al.

(10) Patent No.: US 10,177,292 B2
(45) Date of Patent: Jan. 8, 2019

(54) CARRIER, CARRIER LEADFRAME, AND LIGHT EMITTING DEVICE

(71) Applicant: EVERLIGHT ELECTRONICS CO., LTD., New Taipei (TW)

(72) Inventors: Chung-Chuan Hsieh, New Taipei (TW); Yung Chieh Chen, New Taipei (TW)

(73) Assignee: EVERLIGHT ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/470,009

(22) Filed: Mar. 27, 2017

(65) Prior Publication Data

US 2017/0229625 A1 Aug. 10, 2017

Related U.S. Application Data

(63) Continuation-in-part of application No. 14/720,230, filed on May 22, 2015, now Pat. No. 9,640,733.
(Continued)

(30) Foreign Application Priority Data

May 23, 2014 (TW) .............................. 103118060 A
Feb. 3, 2015 (TW) .............................. 104103527 A

(51) Int. Cl.
*H01L 33/62* (2010.01)
*H01L 33/48* (2010.01)
(Continued)

(52) U.S. Cl.
CPC ............ *H01L 33/62* (2013.01); *H01L 33/483* (2013.01); *H01L 33/486* (2013.01); *H01L 33/60* (2013.01);
(Continued)

(58) Field of Classification Search
None
See application file for complete search history.

(56) References Cited

U.S. PATENT DOCUMENTS 7,462,870 B2 12/2008 Nakashima
8,137,999 B2 3/2012 Wang
(Continued)

FOREIGN PATENT DOCUMENTS

CN 101346584 A 1/2009
JP 2000-036621 A 2/2000
(Continued)

OTHER PUBLICATIONS

U.S. Non-Final Office Action issued in U.S. Appl. No. 15/441,644, dated Jun. 8, 2017.
(Continued)

*Primary Examiner* — Khaja Ahmad
(74) *Attorney, Agent, or Firm* — Sughrue Mion, PLLC

(57) ABSTRACT

A light emitting device may comprise a wing portion of an electrode exposed from the resin housing. The wing portion may be made by a single or multiple stamp cutting process. To increase the connecting region between the electrode and solder, the outer side surface of the wing portion is an uneven surface. The device may further comprise a protective plating layer and an external protective plating layer. The protective plating layer may be coated on the top surface, bottom surface and a portion of the side surface of the electrode. The external portative plating layer would be coated on the outer surface of the wing region. The light reflection of the device from top surface of the electrode portion can be maintained and the outer side surface of wing portion can be protected for improving the reliability of connection between light emitting device and outer substrate.

18 Claims, 31 Drawing Sheets

Related U.S. Application Data

(60) Provisional application No. 62/331,984, filed on May 5, 2016.

(51) Int. Cl.
*H01L 33/60* (2010.01)
*H01L 23/00* (2006.01)

(52) U.S. Cl.
CPC .............. *H01L 24/32* (2013.01); *H01L 24/48* (2013.01); *H01L 24/73* (2013.01); *H01L 24/92* (2013.01); *H01L 24/97* (2013.01); *H01L 2224/32245* (2013.01); *H01L 2224/48247* (2013.01); *H01L 2224/73265* (2013.01); *H01L 2224/92247* (2013.01); *H01L 2924/00014* (2013.01); *H01L 2924/181* (2013.01); *H01L 2933/0033* (2013.01); *H01L 2933/0066* (2013.01)

(56) References Cited

U.S. PATENT DOCUMENTS

| | | | |
|---|---|---|---|
| 8,487,328 | B2 | 7/2013 | Nakabayashi |
| 8,686,464 | B2 | 4/2014 | Inoue et al. |
| 9,024,514 | B2 | 5/2015 | Kato |
| 9,030,096 | B2 | 5/2015 | Kobayashi |
| 9,035,343 | B2 | 5/2015 | Zhang |
| 2003/0011048 | A1 | 1/2003 | Abbott et al. |
| 2003/0230977 | A1* | 12/2003 | Epstein .................. H01L 33/58 313/512 |
| 2004/0016873 | A1 | 1/2004 | Kida et al. |
| 2006/0175716 | A1 | 8/2006 | Nakashima |
| 2007/0246841 | A1 | 10/2007 | Yamamoto |
| 2007/0261374 | A1 | 11/2007 | Nelson |
| 2007/0262328 | A1 | 11/2007 | Bando |
| 2008/0089072 | A1* | 4/2008 | Kim ..................... H01L 33/647 362/294 |
| 2009/0261374 | A1 | 10/2009 | Hayashi |
| 2011/0193111 | A1 | 8/2011 | Seo et al. |
| 2012/0104427 | A1 | 5/2012 | Chan et al. |
| 2012/0127720 | A1 | 5/2012 | Hussell et al. |
| 2012/0132949 | A1 | 5/2012 | Watari |
| 2012/0162998 | A1* | 6/2012 | Takahashi ............. H01L 33/486 362/363 |
| 2013/0214298 | A1* | 8/2013 | Lin ........................ H01L 33/60 257/88 |
| 2013/0270588 | A1 | 10/2013 | Wang |
| 2014/0159098 | A1 | 6/2014 | Chen |
| 2014/0197438 | A1 | 7/2014 | Oh et al. |
| 2016/0365495 | A1 | 12/2016 | Ikenaga et al. |

FOREIGN PATENT DOCUMENTS

| | | |
|---|---|---|
| JP | 2014017460 A | 1/2014 |
| JP | 2014060343 A | 4/2014 |
| JP | 2014606343 A | 4/2014 |
| JP | 2015-226063 A | 12/2015 |
| KR | 3020070049380 | 11/2007 |
| KR | 20100083907 A | 7/2010 |
| TW | D149221 | 9/2012 |
| TW | D154430 | 7/2013 |
| TW | D154432 | 7/2013 |
| TW | 201340410 A | 10/2013 |

OTHER PUBLICATIONS

TW Office Action issued in TW 105127459 dated Apr. 21, 2017.
U.S. Notice of Allowance issued in U.S. Appl. No. 15/441,582, dated Apr. 6, 2017.
European Search Report issued in EP Application No. 15168968.4 dated Oct. 14, 2015.
European Search Report issued in European Patent Application No. 17169634.7 dated Jun. 22, 2017.
Notice of Allowance dated Oct. 2, 2017, issued in U.S. Appl. No. 15/441,644.
Notice of Reasons for Rejection dated Mar. 27, 2018 issued by the Japanese Patent Office in counterpart application No. 2017-089648.

* cited by examiner

CARRIER, CARRIER LEADFRAME, AND LIGHT EMITTING DEVICE

CROSS-REFERENCE TO RELATED APPLICATIONS

This application is a continuation-in-part of U.S. patent application Ser. No. 14/720,230 which was filed on May 22, 2015 and claims the priority benefit to said application as well as U.S. Provisional Application 62/331,984 filed on May 5, 2016, Taiwan Patent Application No. 103118060, filed on May 23, 2014, and Taiwan Patent Application No. 104103527, filed on Feb. 3, 2015, all of which are incorporated herein by reference in their entirety.

TECHNICAL FIELD

The present disclosure relates to a carrier leadframe and a light emitting device made from the carrier leadframe. More particularly, the present disclosure relates to a carrier leadframe for receiving a light emitting diode (LED) chip and a light emitting device made from the leadframe.

BACKGROUND

Unless otherwise indicated herein, approaches described in this section are not prior art to the claims listed below and are not admitted to be prior art by inclusion in this section.

Light emitting diodes (LEDs) have such advantages as a long service life, a small volume, high resistance to shock, low heat generation and low power consumption, so they have been widely used as indicators or light sources in household appliances and various other appliances. In recent years, LEDs have developed towards multicolor and high brightness, so applications thereof have been extended to large-sized outdoor signboards, traffic signal lamps and related fields. In the future, it is even possible that the LEDs become mainstream illumination light sources having both power-saving and environmental protection functions. To impart the LEDs with good reliability, most of the LEDs are subjected to a packaging process to form durable light emitting devices.

In recent years, a dicing-type carrier leadframe has been developed by manufacturers in the art to which the present disclosure belongs. Specifically, a plastic body is molded on a metal sheet material, then a die bonding process, a wire bonding process and an encapsulation process are performed, and then the metal sheet material and the plastic body are diced away simultaneously to form individual light emitting devices that are separate from each other. However, a large amount of plastic and metal dusts tend to be produced during the dicing process, which seriously pollute the surfaces of the final products and thus degrade the reliability of the products. Additionally, this process does not allow for a light-on test prior to the encapsulation process, and measurements can only be made after the products are singulated. However, the final products that have been singulated are piled randomly, and machine measurements on them can only be made after surface orientation and direction adjustment. This requires use of additional instruments and is time consuming.

SUMMARY OF THE PRESENT INVENTION

The following summary is for illustrative purpose only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

In view of the aforesaid problems, the present invention provides a carrier and a carrier leadframe, which has at least one carrier that is separated in advance and mechanically engaged with the leadframe, thereby facilitating quick release of material after die bonding, wire bonding and encapsulation. the finished carrier can also be rapidly detached after the above process. Besides, in the carrier leadframe of the present invention, each carrier is electrically isolated from other carriers, so after LEDs are die bonded and wire bonded to the carriers, the electric measurement can be performed before the release of material. Furthermore, a light emitting device made from the carrier leadframe is also provided in the present invention, and with the advantages of the aforesaid carrier leadframe, the production speed and yield of the light emitting device can be greatly improved.

Moreover, the present light emitting device may comprise a wing portion as a portion of the electrode portion exposed from housing. The wing portion may be made by a single or multiple stamp cutting process, for example a stamp process. The wing portion may be divided the wing portion is further divided into a central area and two edge areas which would be located at the two opposite side of the central area. In order to increase the connecting region between the electrode portion and the solder, it is preferably to design outer side surface of the wing portion as an uneven surface. For example, the outer side surface of edge area may be not level with the outer side surface of the central area.

The electrode portion may be plated with a protective plating layer. The plating layer would be placed before the following molding process or stamp process. After the molding and stamp process, the protective plating layer would still exist on the top surface, bottom surface and a portion of side surface of the electrode portion. The outer side surface of the wing portion may also comprise an external plating layer. The thickness of the external plating layer may not be uniform through the whole outer side surface of the wing portion. For the present invention, the thickness of the outer side surface of the central region can be thicker than the outer side surface of the edge area. In addition, the thickness of the external plating layer is not required to be the same as the protective plating layer as well, but the external plating layer of the central layer can be the same as the thickness of the plating layer on the top surface of the electrode portion. As a result, the light reflection from top surface of the electrode portion can be maintained and also the outer side surface of wing portion can be protected by the external protective plating layer for improving the reliability of connection between light emitting device and outer substrate, for example a PCB substrate.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

A carrier leadframe of the present invention comprises a frame body and a carrier, and the carrier includes a housing and at least one electrode portion. In the present invention, the frame body includes at least one supporting portion and is mechanically engaged with the carrier so that the carrier is supported on the frame body. In a specific embodiment of the present invention, the housing may have a concave portion mating with the supporting portion, and the carrier is supported on the frame body through the engagement between the supporting portion and the concave portion. The position of the concave portion is not particularly limited in the present invention, and the concave portion may be located at a side surface or at the border between a bottom surface and the side surface of the carrier. The supporting portion goes deep into the carrier or is only positioned on the bottom surface of the carrier with a half thereof being exposed outside.

Figure 1:
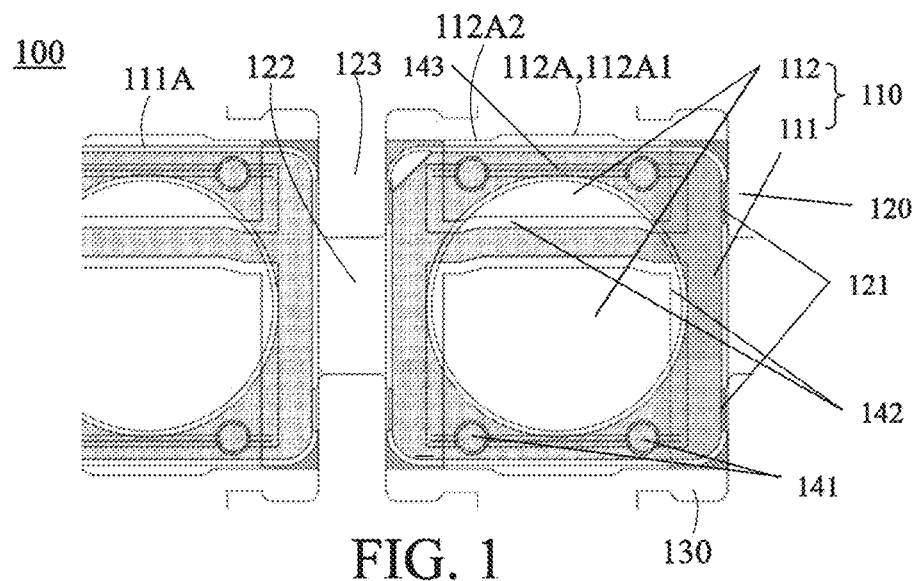
FIG. 1 is a partial schematic view of an exemplary embodiment of a carrier leadframe according to the present disclosure.

FIG. 1 is a partial schematic view of an embodiment of a carrier leadframe according to the present disclosure. As shown in FIG. 1, a carrier leadframe 100 comprises a carrier 110 and a frame body 120, and the carrier 110 comprises a housing 111 and two electrode portions 112. The frame body 120 comprises a plurality of supporting portions 121. As shown in FIG. 1, the frame body 120 beneath the carrier leadframe 100 comprises four supporting portions 121, and four concave portions are formed at the border between the side surfaces and the bottom surface of the housing 111 (corresponding to positions of the supporting portions 121) so that each of the four supporting portions 121 is positioned on the bottom surface of the carrier 110 with a half thereof being exposed outside. In an embodiment, the carrier 110 further comprises a reflection concave cup to expose a part of each of the electrode portions 112. The electrode portion 112 extends outwardly from the reflection concave cup through the housing 111 to the outside.

Figure 3:
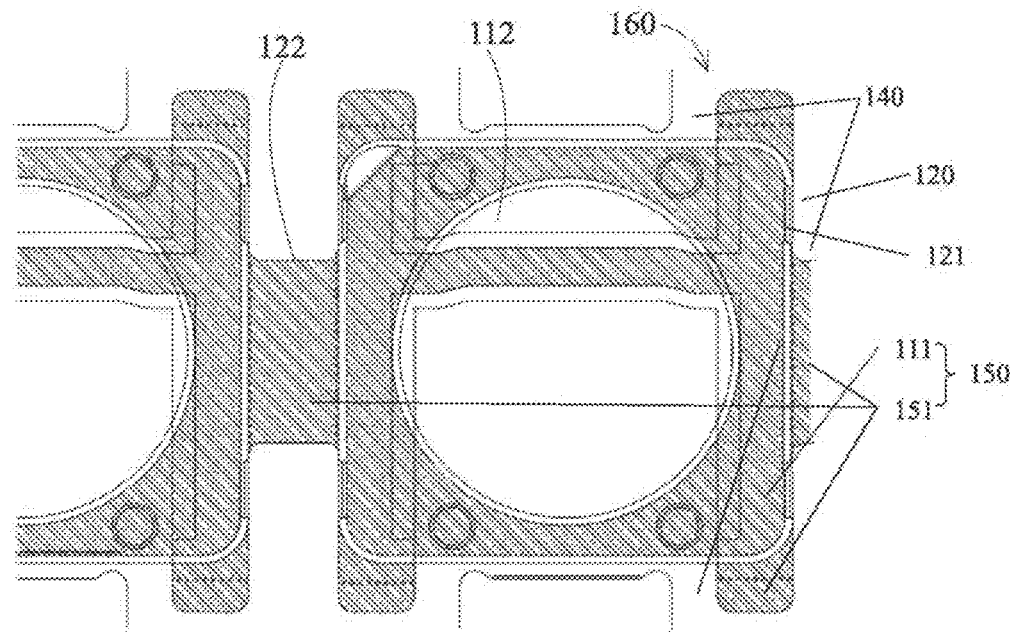
FIG. 3 is a partial schematic view of the carrier leadframe of FIG. 1 after a plastic body is formed.

The frame body 120 may also have a runner area 122 and a side portion 123, and the runner area 122 is disposed on the side portion 123. The runner area 122 is a through area that allows a plastic body 150 (as shown in FIG. 3) to be described later to flow therethrough, and the supporting portion 121 is disposed also on the side portion 123.

Additionally, each of the electrode portions 112 may also be formed with pinholes, grooves (linear slits on the surface of the electrode portion) and steps in the present disclosure. The mechanical binding force between the housing and the electrode portion of the carrier can be increased due to the pinholes, the grooves and the steps. As shown in FIG. 1, each of the two electrode portions 112 in the carrier 110 comprises two pinholes 141 and three grooves 143, and steps 142 are provided on edges of the two electrode portions 112 that are surrounded by the housing 111, thereby increasing the binding strength between the housing 111 and the electrode portions 112.

Each carrier in the carrier leadframe of the present disclosure is supported on the frame body via the mechanical engagement between the concave portion and the supporting portion, and the electrode portions of different carriers are electrically isolated from each other. Thus, after the die bonding process, the wire bonding process and the encapsulation process subsequently performed on the light emitting devices, the electric measurement can be made on the light emitting devices that have not been singulated (i.e., the light emitting devices that are still supported on the frame body in a regular way). Since the light emitting devices are arranged regularly, equipment and time required for surface orientation and direction adjustment are eliminated and the production speed of the light emitting devices can be greatly improved.

The carrier leadframe of the present disclosure may be manufactured in the following way. First, a conductive sheet is provided. The conductive sheet comprises a frame body, at least one void area and at least one extending portion, and the frame body comprises at least one supporting portion. Then, a plastic body is formed on the conductive sheet to cover at least a part of the extending portion and at least a part of the supporting portion and to fill at least a part of the void area. Subsequently, the part of the extending portion exposed outside the housing and a part of the plastic body filled within the void area are respectively removed so as to form the carrier. In particular, after the two removing steps, the housing of the carrier is formed by the remaining plastic body, and the electrode portion of the carrier is formed by the extending portion remaining on the plastic body.

Figure 2:
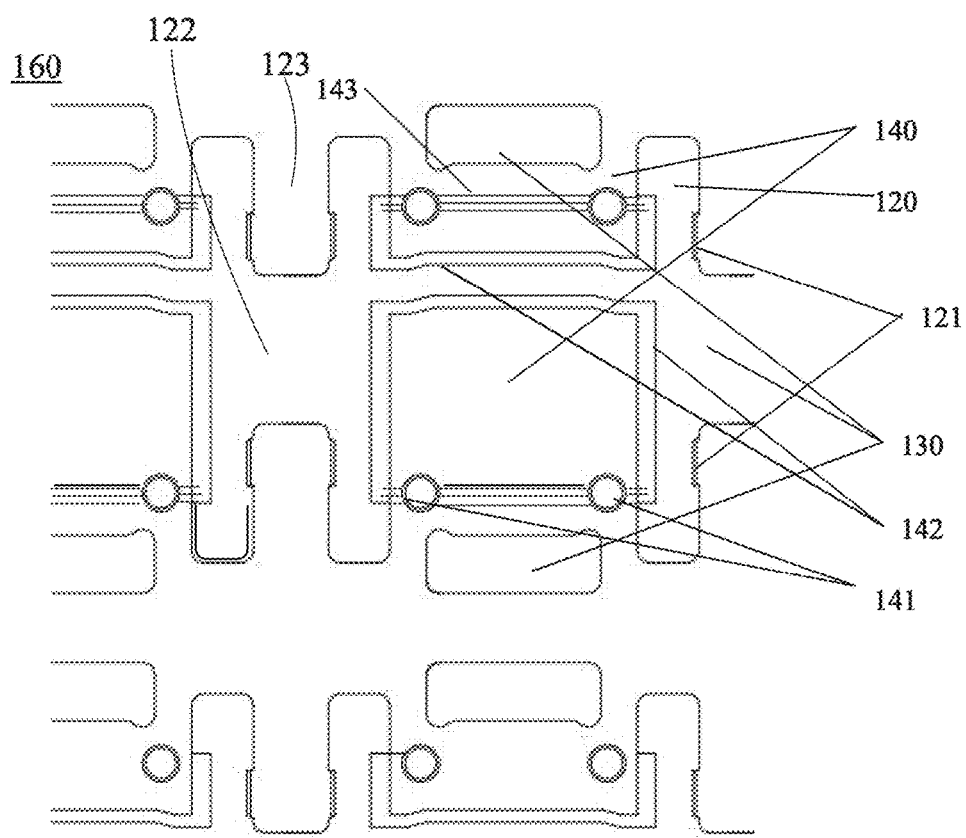
FIG. 2 is a partial schematic view of a conductive sheet used in the carrier leadframe of FIG. 1.

Hereinafter, the manufacturing process of the carrier leadframe 100 of FIG. 1 will be detailed with reference to FIG. 2 to FIG. 4A. First, a conductive sheet 160 as shown in FIG. 2 is provided. The conductive sheet 160 comprises a frame body 120, a plurality of void areas 130 and a plurality of extending portions 140. The frame body 120 also comprises a plurality of supporting portions 121, and each of the extending portions 140 comprises a plurality of pinholes 141, grooves 143 and steps 142. Finally, the part of each of the extending portions 140 exposed outside the housing is removed to form the carrier leadframe 100 of FIG. 1.

In the present disclosure, the conductive sheet may be made of a metal sheet, including a pure metal sheet, an alloy sheet, and a metal composite sheet, and the composite sheet is preferably a metal sheet cladded with a conductive layer having a relatively high resistance to oxidation or a relatively high solder binding force (e.g., a silver-plated copper sheet, or the like). The frame body, the extending portion and the void portion are formed in an appropriate way. When the conductive sheet is made of a metal sheet, the frame body, the extending portion and the void portion may be preferably formed through a stamping process; however, they may also be formed through a dicing process or a mold casting process. Moreover, if the conductive sheet has insufficient conductivity, a conductive layer (not shown) may be formed on the conductive sheet after the conductive sheet is provided (the conductivity of the conductive layer is higher than that of the conductive sheet) so as to increase the reliability of the subsequent test. The material of the conductive layer may include materials having high conductivity (e.g., silver, or the like).

After the conductive sheet is provided, a plastic body is then formed on the conductive sheet. The way in which the plastic body is formed is not limited. For Example, the plastic body may be formed through transfer molding, injection molding, etc. The material of the plastic body is not limited. For example, it may be selected from plastic materials commonly used in this industry, e.g., epoxy compositions, silicon compositions, polyphthalamide compositions, or polyethylene terephthalate compositions. In a specific embodiment of the present disclosure, the plastic body is made of an epoxy composition through transfer molding. In another embodiment, the plastic body may be a thermosetting material and may further comprise a reflective material, e.g., titanium dioxide (TiO2), zinc oxide (ZnO) or boron nitride (BN).

Next, a plastic body 150 is formed on the conductive sheet 160 as shown in FIG. 3. The plastic body 150 covers a part of each of the extending portions 140 and completely covers all of the pinholes 141 and grooves 143. The plastic body 150 also fills a part of the void area 130 (the part of the void area 130 above and below the extending portion 140 is not filled) and completely covers all of the supporting portions 121. The plastic body 150 also fills the runner area 122 and is formed integrally with another adjacent plastic body 150.

Further speaking, during the formation of the plastic body 150 in the present disclosure, the material of the plastic body 150 will fill the mold cavity of the mold and the void area. In this step, the housing 111 and the residual material 151 are still held together. The scope of the residual material 151 is defined depending on the subsequent application of the product. As shown in FIG. 3, what denoted by dotted lines is the residual material 151 defined in this embodiment.

Figure 4A:
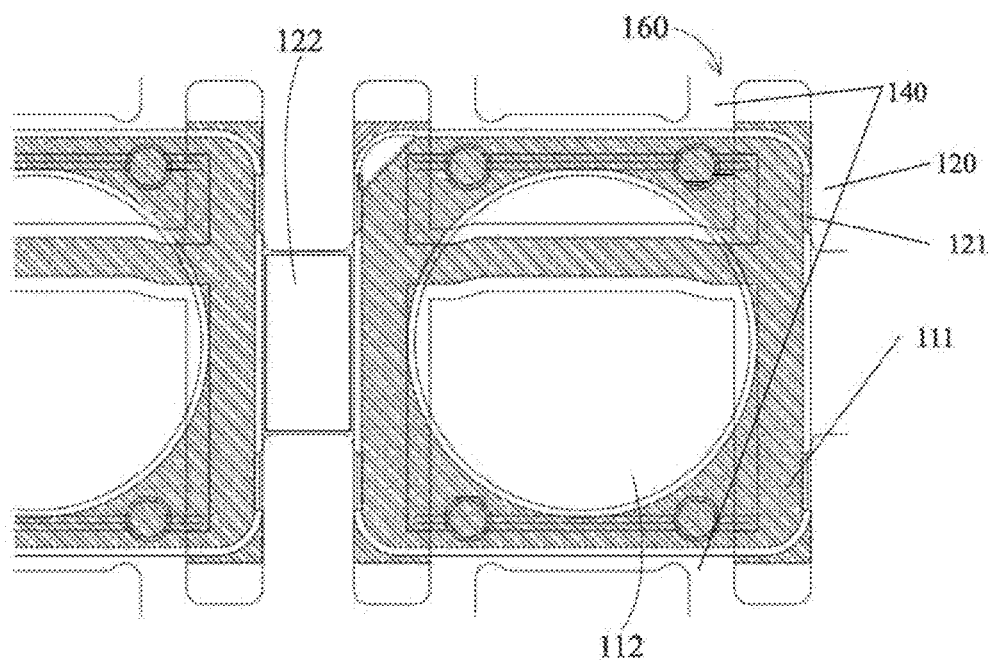
FIG. 4A and FIG. 4B are partial schematic views of the carrier leadframe of FIG. 1 after the residual material is removed.

Thereafter, the defined residual material 151 is removed as shown in FIG. 4A, thereby forming the housing 111 of the carrier 110.

If the runner area 122 is filled with the plastic body 150, the residual material 151 may be removed in at least two steps, e.g., by firstly removing the residual material 151 filled in the runner area 122 and then removing the residual material 151 filled in the void area 130 or vice versa. This can simplify the arrangement of knives for removing the residual material 151 in each step so that the knives have sufficient distances therebetween and desirable strength.

Figure 4B:
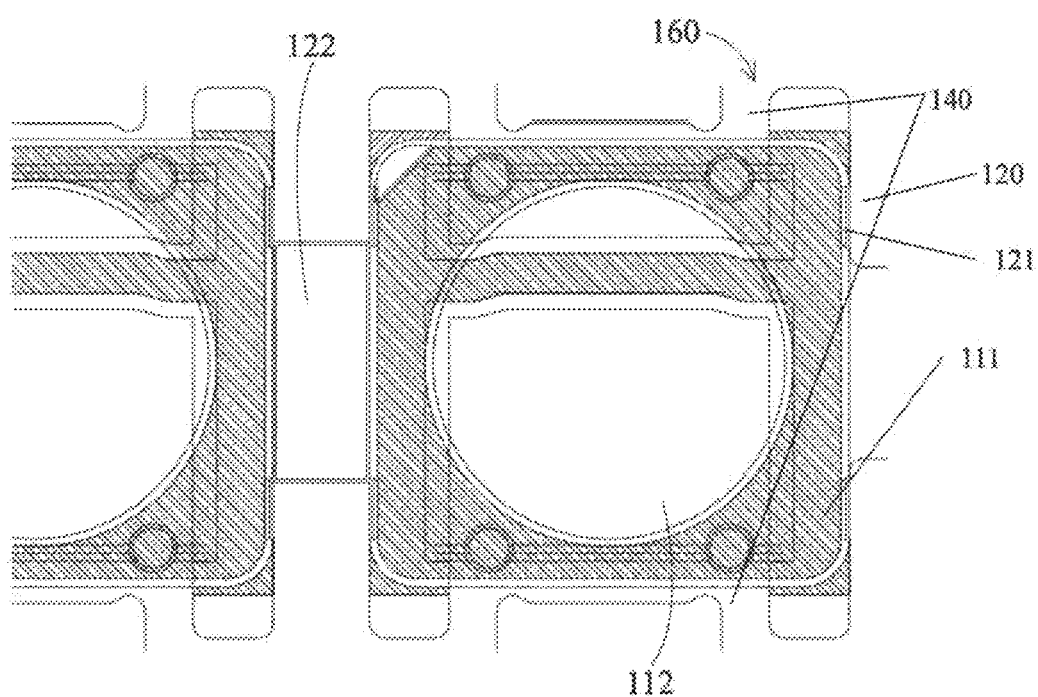

Finally, the part of each of the extending portions 140 exposed outside the housing 111 is removed to form the carrier leadframe 100 as shown in FIG. 1. Before the part of each of the extending portions 140 is removed, the part of the frame body 120 at two sides of the runner area 122 may be removed optionally with a knife of a length larger than that of the runner area 122 so as to thoroughly remove the residual material 151 possibly left in the runner area 122; thus, the damage to the electrode portions 112 or the light emitting diode (LED) chips can be avoided by preventing the residual material 151 from falling off onto the electrode portions 112 or the LED chips. After the part of the frame body 120 at the two sides of the runner area 122 is removed, the length of the runner area 122 is increased as shown in FIG. 4B.

Therefore, the manufacturing method of this embodiment may optionally perform two or more removing steps on the conductive sheet 160 and may also perform two or more removing steps on the plastic body 150 (the residual material 151).

In the present disclosure, the residual material 151 and parts of the extending portions 140 are removed separately. In particular, the order in which the residual material 151 and the parts of the extending portions 140 are removed is not particularly limited as long as they are separately removed. For example, it may be that all the parts of the extending portions 140 are simultaneously removed after all the residual material 151 is simultaneously removed, or all the residual material 151 is removed after all the parts of the extending portions 140 are simultaneously removed, or part of the residual material 151 and parts of the extending portions 140 are removed alternately in different stages. The way in which the removing steps are performed is not limited, and the removing steps may be accomplished for example through a dicing process or a stamping process but preferably be accomplished through the stamping process. The stamping process is taken as an example in the embodiments of the present disclosure.

The tools and the working strength can be adjusted depending on the mechanical properties of the parts to be removed in the present disclosure. In particular, the respective removing steps can avoid drawbacks resulting from removing different materials simultaneously, e.g., plane defects or damage to the removing tools (knives) due to non-uniform stresses. Additionally, dusts of the plastic body tend to be produced during the removal of the plastic body as compared to the removal of the extending portion. The dusts can only be removed by a strong external force, e.g., through strong air blowing, shaking, or ultrasonic waves. If the cleaning step is to be performed after the residual material and the extending portion are simultaneously removed, it is possible that the bonding force between the carrier and the frame body is insufficient to avoid falling off of the material. Thus, in the present disclosure, the cleaning step (i.e., the cleaning of the plastic body) is preferably performed after the residual material is removed and before the extending portion is removed. This can enhance the connection strength between the carrier and the leadframe by means of the extending portion so as to avoid falling off of the material during the cleaning step, and finally the extending portion is removed.

After the removing steps, at least one electrode portion cross section will be formed on the electrode portion of the carrier, and a housing cross section will be formed by the residual material on the housing of the carrier. In the present disclosure, the electrode portion cross section and the housing cross section may be located on a same surface or different surfaces of the carrier depending on the safety specification of the final product or depending on the customer requirements. Further speaking, when the electrode portion cross section and the housing cross section are located on the same surface of the carrier, the electrode portion cross section and the housing cross section may be level with each other (i.e., form a flat surface) or may not be level with each other (i.e., do not form a flat surface).

Figure 5:
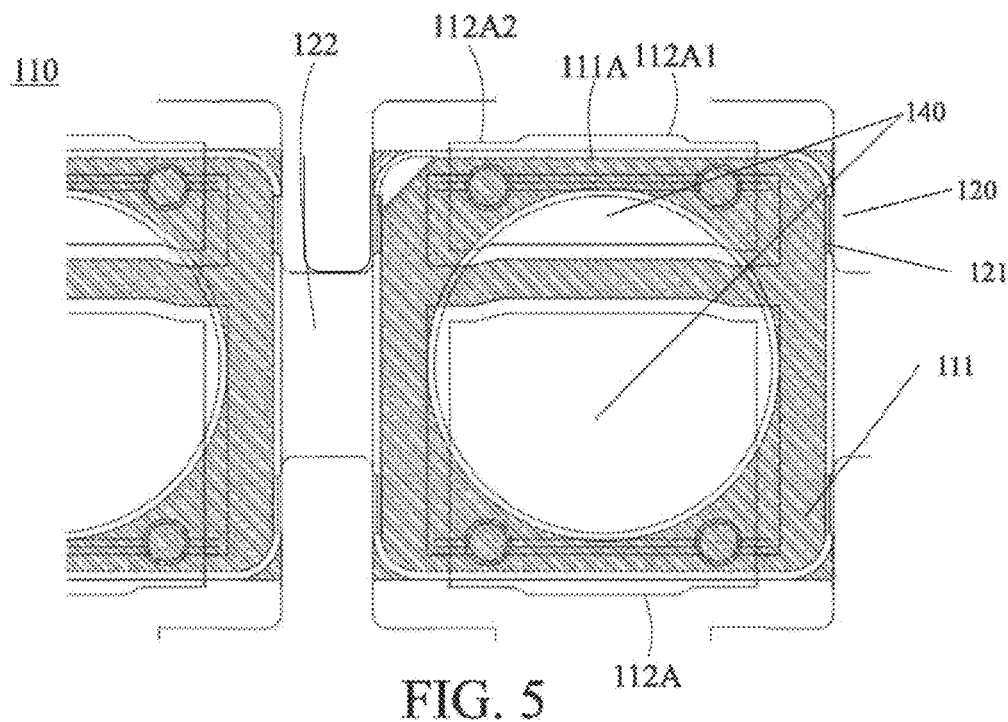
FIG. 5 is a partial schematic view of an exemplary embodiment of the carrier leadframe according to the present disclosure.

As shown in FIG. 1, the electrode portion 112 has a wing portion 112A exposed outside the housing, and the wing portion 112A comprises a central protruding area (or called central area) 112A1 and two outer edge areas (or called edge areas) 112A2. In the embodiment of FIG. 1, each of the edge areas 112A2 comprises an electrode portion cross section 203, and the electrode portion cross sections 203 are level with a part of the housing cross section 111A of the housing 111; and in this case, the carrier has a relatively flat appearance. However, as shown in FIG. 5, the wing portion 112A of the electrode portion 112 comprises a central protruding area 112A1 and two outer edge areas 112A2, and the electrode portion cross section 203 of the electrode portion 112 is not level with the housing cross section 111A of the housing 111; and in this case, the electrode portion 112 has an additional lateral area that can increase the binding force with the solder so as to increase the component bonding strength of the light emitting devices after the subsequent component bonding process.

Moreover, in case where the conductive sheet is a metal composite sheet with an antioxidant layer, a cross section uncovered with the antioxidant layer will be formed on the electrode portion cross section 203. In the present disclosure, the cross section uncovered with the antioxidant layer is preferably formed integrally with the central area of the electrode portion. During the subsequent component bonding process, the solder may climb along the side surface of the wing portion and cover the side surface, and in this case, at least a part of the cross section uncovered with the antioxidant layer can be covered by the solder to reduce the probability that the cross section portion is oxidized. Additionally, the cross section uncovered with the antioxidant layer and the surface of the adjacent central area are at the same side, and preferably form a continuous surface so as to reduce sharp points or rough edges of the electrode portion. Otherwise, the sharp points or rough edges would cause wear of the subsequent processing machine, and what is worse, a charge accumulation effect might occur at the sharp points or the rough edges to influence the reliability of the finally product.

The present disclosure also provides a light emitting device made from the carrier leadframe of the present disclosure, and the light emitting device comprises a carrier, an LED chip and an encapsulant. The LED chip is carried within the carrier and covered by the encapsulant. The material of the encapsulant in the present disclosure may be a plastic composite of epoxy resins or silicone. Moreover, the light emitting device of the present disclosure may optionally have fluorescent materials added into the encapsulant, and examples of the fluorescent materials include: aluminate fluorescent materials (e.g., doped yttrium aluminum oxide compounds, doped lutetium aluminum oxide compounds, doped terbium aluminum oxide compounds, or combinations thereof), silicate fluorescent materials, sulfide fluorescent materials, oxynitride fluorescent materials, nitride fluorescent materials, fluoride fluorescent materials, or combinations thereof.

The light emitting device of the present disclosure may be manufactured in the following way. First, a carrier leadframe as described above is provided. Then, an LED chip is provided and die bonded and wire bonded into the reflection concave cup of the carrier. Thereafter, the reflection concave cup is filled with an encapsulant so as to encapsulate the LED chip to form a light emitting device on the frame body. Finally, the light emitting device is separated from the frame body (i.e., the carrier is separated from the frame body for example through extrusion) to form a separate light emitting device.

A plurality of LED chips may also be provided within the carrier in the present disclosure, and these LED chips can emit lights of the same or different spectrums. After the LED chips are fixed, the wire bonding process may be performed to electrically connect the LED chips with the electrode portion. Other electronic elements, e.g., a Zener diode or a thermistor, may also be provided depending on requirements of the final product.

Figure 6:
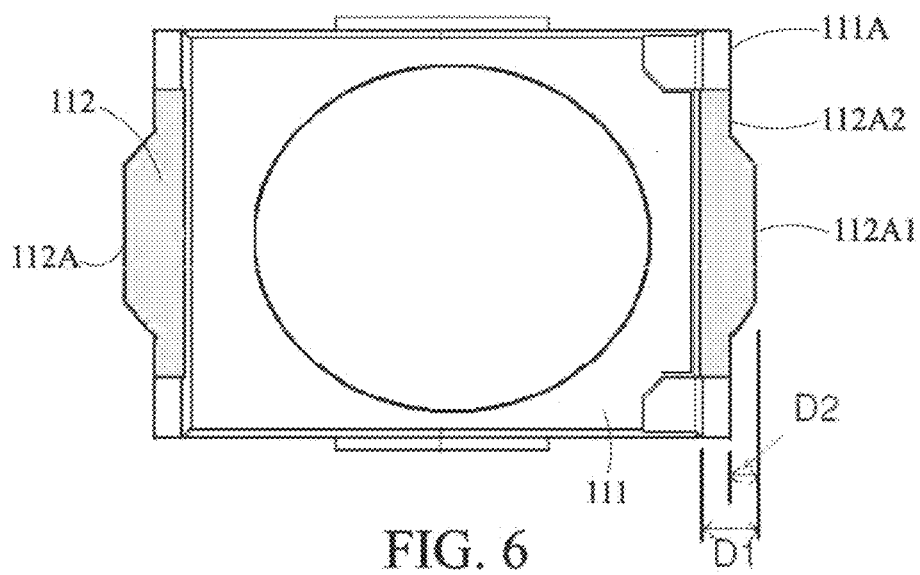
FIG. 6 is a top view of a light emitting device according to an embodiment of the present disclosure.

Referring to FIG. 6, a top view of a light emitting device according to an embodiment of the present disclosure is shown therein. The wing portion 112A of the electrode portion 112 has a central area 112A1 and two edge areas 112A2, and the central area 112A1 protrudes from the two edge areas 112A2. The wing portion 112A protrudes out of the housing cross section 111A of the housing 111 so that the central area 1112A1 of the wing portion 112A of the electrode portion 112 is not coplanar with the housing cross section 111A of the housing 111. An interval D1 is the distance between the central area of the wing portion 112A of the electrode portion 112 and the inner side of the housing cross section 111A of the housing 111, and the interval D1 is about 0.1 mm. An interval D2 is the distance between the central area 112A1 of the wing portion 112A of the electrode portion 112 and the outer side of the wing portion 112A of the housing 111 (i.e., the central area 112A1 of the wing portion 112A of the electrode portion 112 and the wing portion 112A of the housing 111), and the interval D2 is about 0.05 mm.

Figure 7:
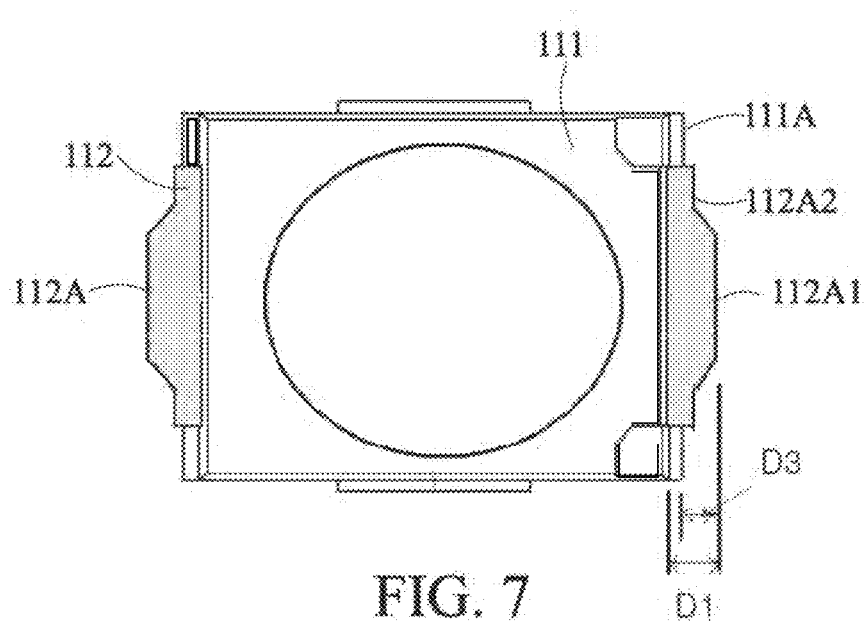
FIG. 7 is a top view of a light emitting device according to another embodiment of the present disclosure.

Referring to FIG. 7, a top view of a light emitting device according to another embodiment of the present disclosure is shown therein. The wing portion 112A of the electrode portion 112 has a central area 112A1 and two edge areas 112A2, and the wing portion 112A protrudes out of the housing cross section 111A of the housing 111 so that the wing portion 112A of the electrode portion 112 is not coplanar with the housing cross section 111A of the housing 111. The interval D1 is the distance between the central area of the wing portion 112A of the electrode portion 112 and the inner side of the housing cross section 111A of the housing 111, and the interval D1 is about 0.1 mm. An interval D3 is the distance between the central area 112A1 of the wing portion 112A of the electrode portion 112 and the outer side of the cross section 111A of the housing 111, and the interval D3 is about 0.075 mm.

Figure 8:
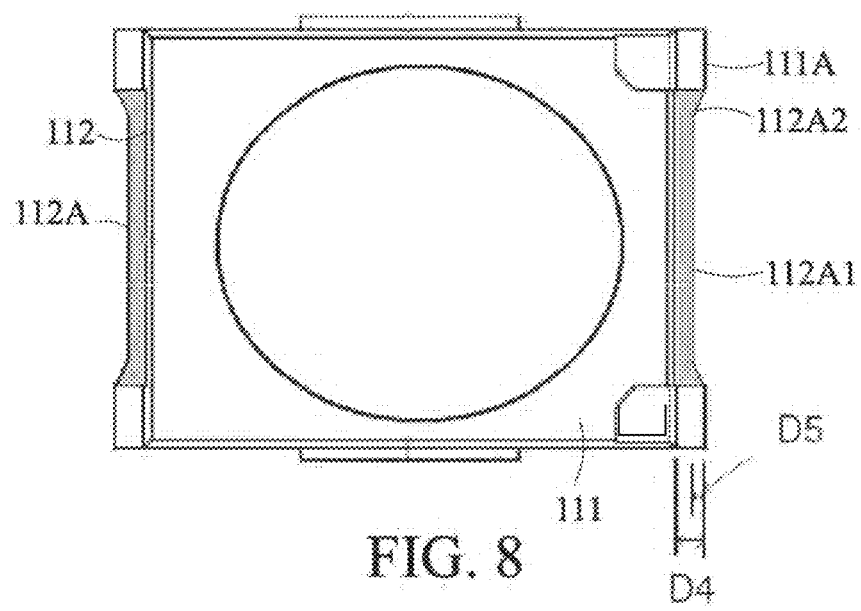
FIG. 8 is a top view of a light emitting device according to a further embodiment of the present disclosure.

Referring to FIG. 8, a top view of a light emitting device according to a further embodiment of the present disclosure is shown therein. The wing portion 112A of the electrode portion 112 has a central area 112A1 and two edge areas 112A2, the central area 112A1 is recessed from the two edge areas 112A2, and the electrode portion cross sections 203 of the two edge areas 112A2 are sloping surfaces. The wing portion 112A is recessed into the cross section 111A of the housing 111 so that the wing portion 112A of the electrode portion 112 is not coplanar with the cross section 111A of the housing 111. An interval D4 is the distance between the outer side and the inner side of the cross section 111A of the housing 111, and the interval D4 is about 0.05 mm. An interval D5 is the distance between the central area of the wing portion 112A of the electrode portion 112 and the outer side of the cross section 111A of the housing 111, and the interval D5 is about 0.025 mm.

Figure 9:
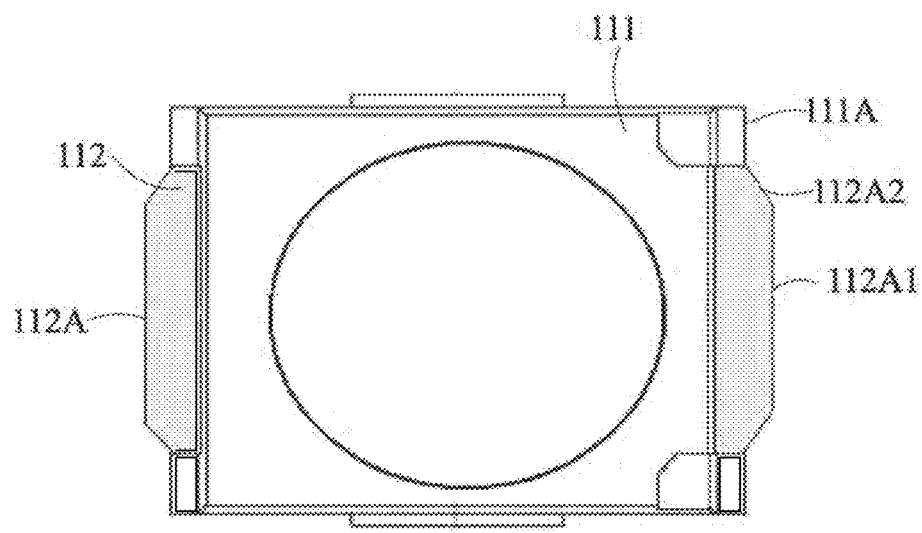
FIG. 9 is a top view of a light emitting device according to yet another embodiment of the present disclosure.

Referring to FIG. 9, a top view of a light emitting device according to yet another embodiment of the present disclosure is shown therein. The wing portion 112A of the electrode portion 112 has a central area 112A1 and two edge areas 112A2, the central area 112A1 protrudes out of the two edge areas 112A2, and the electrode portion cross sections 203 of the two edge areas 112A2 are sloping surfaces. The wing portion 112A protrudes out of the cross section 111A of the housing 111 so that the wing portion 112A of the electrode portion 112 is not coplanar with the cross section 111A of the housing 111.

Figure 10:
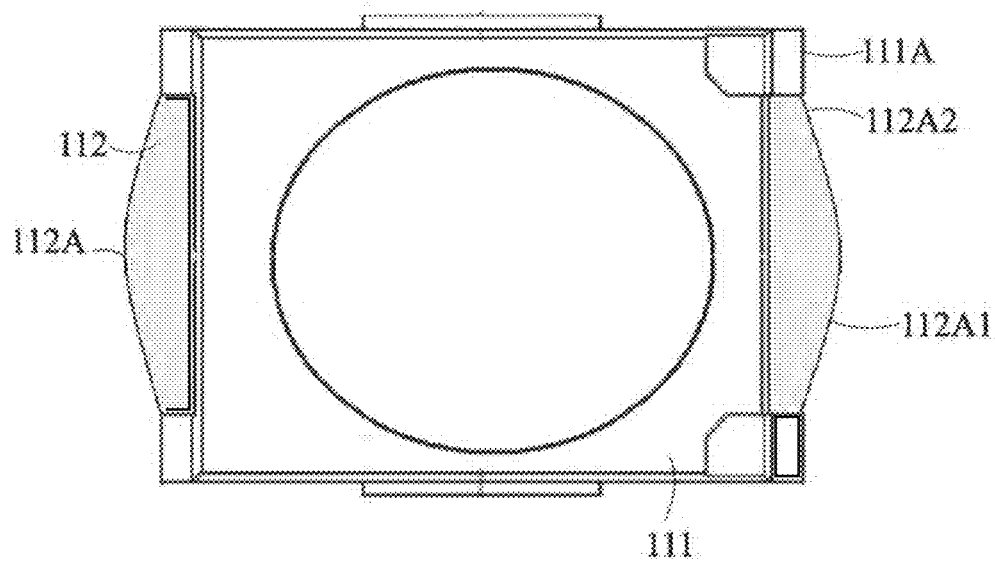
FIG. 10 is a top view of a light emitting device according to yet a further embodiment of the present disclosure.

Referring to FIG. 10, a top view of a light emitting device according to yet a further embodiment of the present disclosure is shown therein. The wing portion 112A of the electrode portion 112 is a convex curved surface, i.e., the external surface of the central area and the outline (the electrode portion cross sections 203) of the edge areas together form a continuous convex curved surface. The wing portion 112A protrudes out of the cross section 111A of the housing 111 so that the wing portion 112A of the electrode portion 112 is not coplanar with the cross section 111A of the housing 111.

Figure 11:
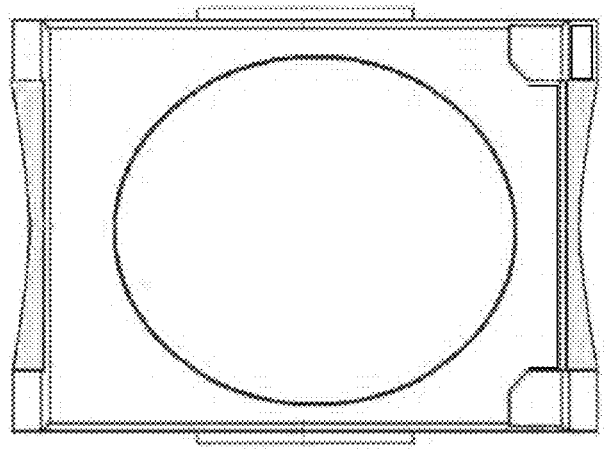
FIG. 11 is a top view of a light emitting device according to still another embodiment of the present disclosure.

Referring to FIG. 11, a top view of a light emitting device according to still another embodiment of the present disclosure is shown therein. The wing portion 112A of the electrode portion 112 is a concave curved surface, i.e., the external surface of the central area and the outline (the electrode portion cross sections 203) of the edge areas together form a continuous concave curved surface. The wing portion 112A is recessed into the cross section 111A of the housing 111 so that the wing portion 112A of the electrode portion 112 is not coplanar with the cross section 111A of the housing 111.

Referring to FIG. 12A to FIG. 12D, schematic views (i.e., a top view, a cross-sectional view taken along the front-to-back direction, a cross-sectional view taken along the left-to-right direction, and a partially enlarged view) of a carrier leadframe 100' according to an embodiment of the present disclosure are shown therein. The carrier leadframe 100' is similar to the aforesaid carrier leadframe 100. That is, the carrier leadframe 100' also comprises a frame body 120 and a carrier 110, the frame body 120 comprises at least one supporting portion 121, the carrier 110 comprises a housing 111 and at least one electrode portion 112, and the housing 111 is mechanically engaged with the frame body 120 via the supporting portion 121. Thus, for the technical contents of the aforesaid elements, reference may be made to the counterparts of the carrier leadframe 100.

Preferably, the at least one electrode 112 may be two electrode portions 112 spaced apart from each other to respectively serve as an anode terminal and a cathode terminal of the carrier 110. The two electrode portions 112 are surrounded by the frame body 120, i.e., the two electrode portions 112 are located within a space surrounded by the frame body 120 itself. The two electrode portions 112 may be separated from the frame body 120 by at least one void area 130 so that the two electrode portions 112 will not make contact with the frame body 120 and thus be electrically isolated from the frame body 120.

The supporting portion 121 of the frame body 120 extends towards one of the two electrode portions 112, but will not make contact with the electrode portion 112. In this embodiment, there are four supporting portions 121 that are distributed at two sides of the electrode portions 112. The housing 111 may at least cover the supporting portions 121 and at least a part of the two electrode portions 112, and is at least disposed within a part of the void area 130. Thereby, the housing 111 is mechanically engaged with the frame body 120 via the supporting portions 121, and the housing 111 is also mechanically engaged with the two electrode portions 112 so that the housing 111 and the two electrode portions 112 can be held within the frame body 120 without falling off from the frame body 120.

Figure 13A:
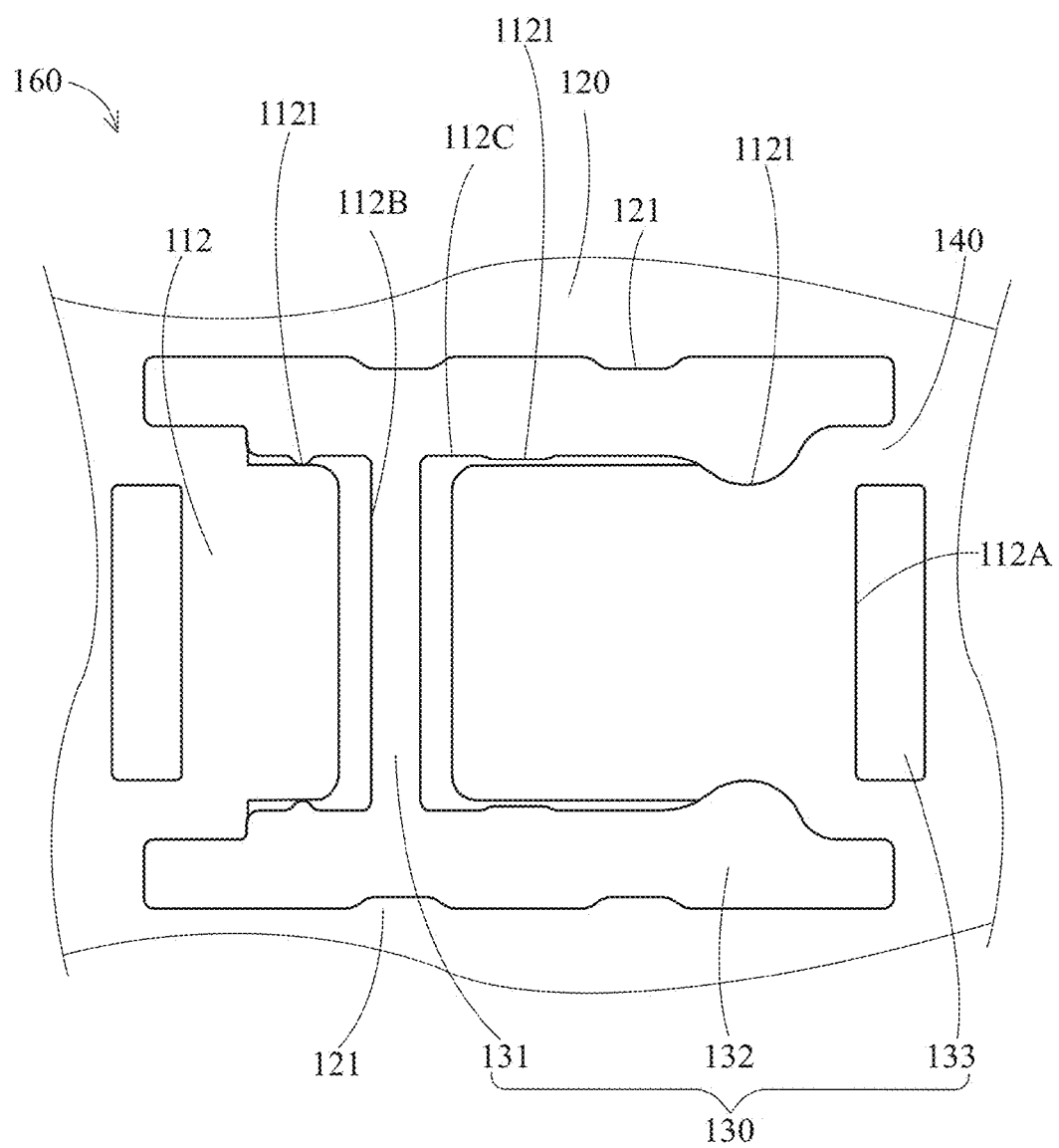
FIG. 13A to FIG. 16 are schematic views illustrating steps of a method for manufacturing a carrier leadframe according to an embodiment of the present disclosure.

The shape features of the electrode portions 112 will be further described. Referring to FIG. 13A, each of the two electrode portions 112 has a wing portion 112A and an inner side surface 112B that are disposed opposite to each other (i.e., disposed oppositely), the wing portion 112A may be exposed outside the housing cross section 111A of the housing 111 (reference may be made to the aforesaid relevant descriptions of FIG. 6 to FIG. 11) and does not face the wing portion 112A of another electrode portion 112. The inner side surfaces 112B of the two electrode portions 112 may face each other, and at least a part of the two electrode portions 112 may be covered by the housing 111.

Each of the two electrode portions 112 further comprises two connecting surfaces 112C disposed opposite to each other, and each of the connecting surfaces 112C connects the wing portion 112A with the inner side surface 112B. That is, an edge (e.g., a front edge) of the connecting surface 112C connects with an edge (i.e., a left edge) of the wing portion 112A, while another edge (e.g., a back edge) of the connecting surface 112C connects with an edge (i.e., a left edge) of the inner side surface 112B. The wing portion 112A, the inner side surface 112B and the two connecting surfaces 112C may not be flat surfaces. That is, the wing portion 112A, the inner side surface 112B and the two connecting surfaces 112C may be uneven or stepped surfaces.

Each of the two electrode portions 112 may further comprise at least one recess 1121, and the recess 1121 may be disposed on the connecting surface 112C so that the connecting surface 112C becomes an uneven surface. The recess 1121 can increase the contact area between the electrode portion 112 and the housing 111 (the plastic body 150) and strengthen the fastening effect between the electrode portion 112 and the housing 111 by virtue of the corresponding geometric relationships so that the binding force between the electrode portion 112 and the housing 111 is relatively strong. If there are a plurality of recesses 1121, the recesses 1121 may be sized differently according to different binding forces required at different positions between the electrode portion 112 and the housing 111.

The wing portion 112A, the inner side surface 112B and the two connecting surfaces 112C of the two electrode portions 112 may have the at least one void area 130 divided into a plurality of void areas 130, namely a gap 131, two first through grooves 132 and two second through grooves 133 in communication with each other. The gap 131 is disposed between the inner side surfaces 1128 of the two electrode portions 112, and the two first through grooves 132 are disposed along the two connecting surfaces 112C of the two electrode portions 112. That is, one of the first through grooves 132 extends from an edge of one connecting surface 112C of one electrode portion 112 to an edge of one connecting surface 112C, which faces the same direction, of the other electrode portion 112. The two first through grooves 132 are spaced apart from each other.

The two second through grooves 133 are disposed along the wing portions 112A of the two electrode portions 112. That is, each of the second through grooves 133 extends only along the wing portion 112A of one of the electrode portions 112. The two second through grooves 133 are also spaced apart from each other.

Figure 12A:
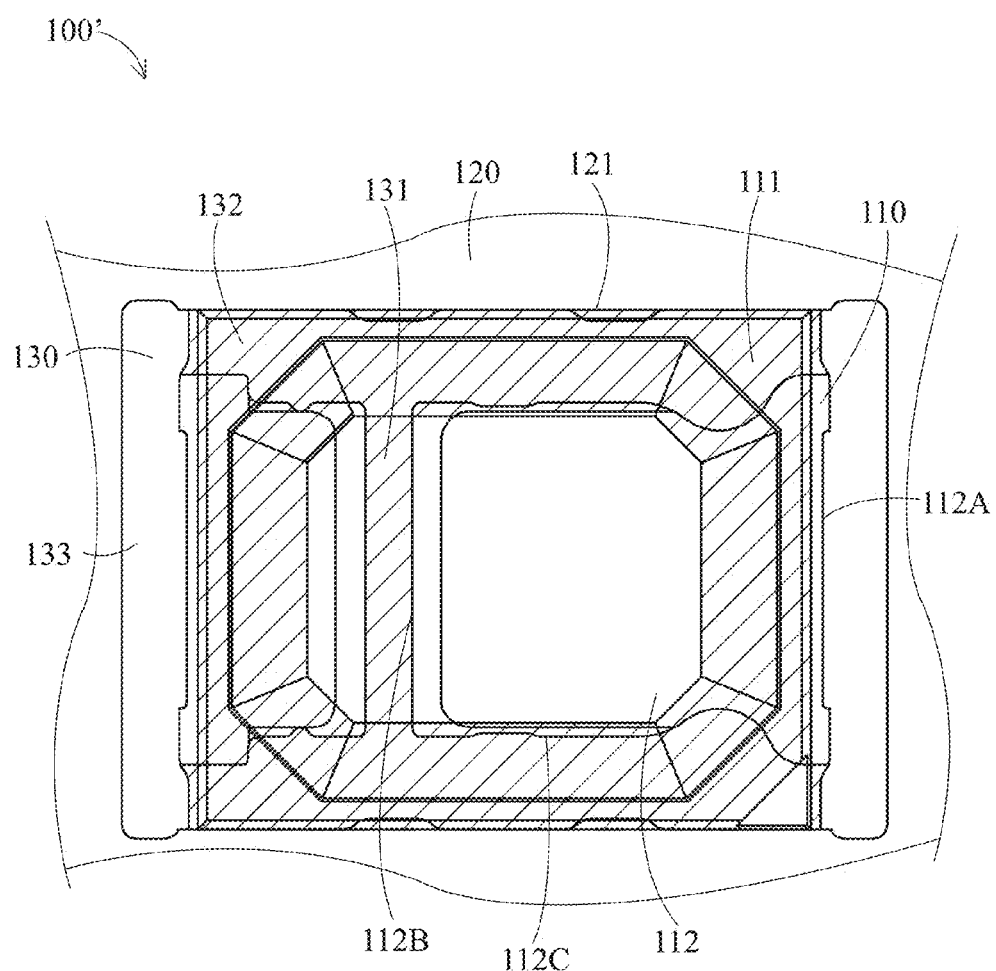
FIG. 12A to FIG. 12D are respectively a top view, a cross-sectional view taken along the front-to-back direction, a cross-sectional view taken along the left-to-right direction, and a partially enlarged view of a carrier leadframe according to an embodiment of the present disclosure.
Figure 12B:
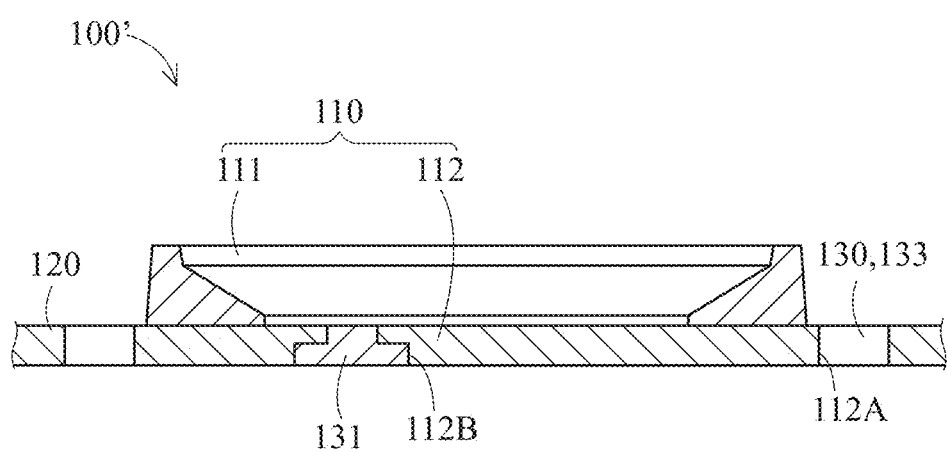
Figure 12C:
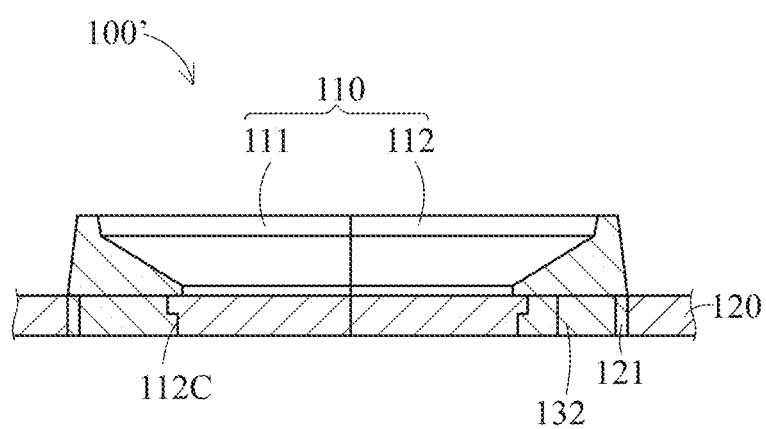
Figure 12D:
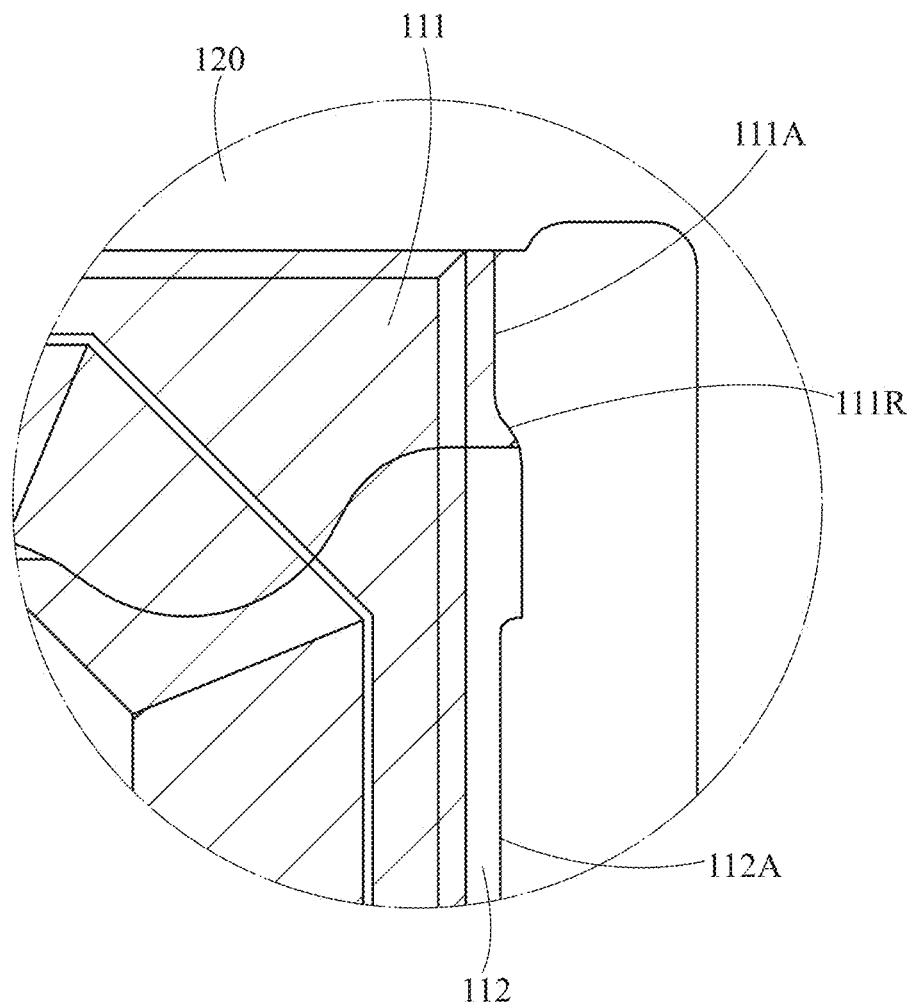

The supporting portion 121 of the frame body 120 may extend towards one of the two connecting surfaces 112C of the two electrode portions 112 into one of the two first through grooves 132. The housing 111 may be optionally disposed within the two first through grooves 132 and/or the gap 131. Additionally, the housing cross section 111A of the housing 111 may at least comprise a curved surface, e.g., may have a rounded corner 111R as shown in FIG. 12D. The housing cross section of the housing 111 has the rounded corner that is connected to the electrode portion cross section 203 of the electrode portion 112. The rounded corner 111R can disperse the impact force so that the rounded corner 111R is unlikely to be broken or cracked by the impact force during a vibration test of the singulated carrier 110. Moreover, in the embodiment as shown in FIG. 12D, the housing cross section and the electrode portion cross section do not form a flat surface, i.e., the housing cross section is not level with the electrode portion cross section.

According to the above descriptions, the carrier leadframe 100' can also allow the electrode portions 112 of the carriers 110 to be electrically isolated from each other. Thus, after the die bonding process, the wire bonding process and the encapsulation process are subsequently performed on the light emitting devices, the electric measurement can be directly performed on the light emitting devices that are not singulated, and this greatly improves the production speed of the light emitting devices. It shall be further appreciated that, the technical contents of the carrier leadframe 100' may also be used as a reference for the carrier leadframe 100.

An embodiment of the present disclosure further provides a method for manufacturing a carrier leadframe, which can at least manufacture the aforesaid carrier leadframe 100'. The method for manufacturing the carrier leadframe 100' is similar to the method for manufacturing the aforesaid carrier leadframe 100 and comprises the following steps.

Figure 13B:
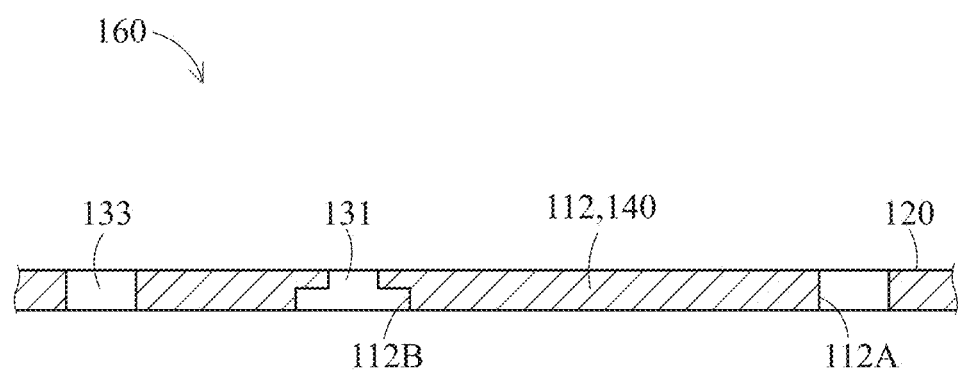
Figure 13C:
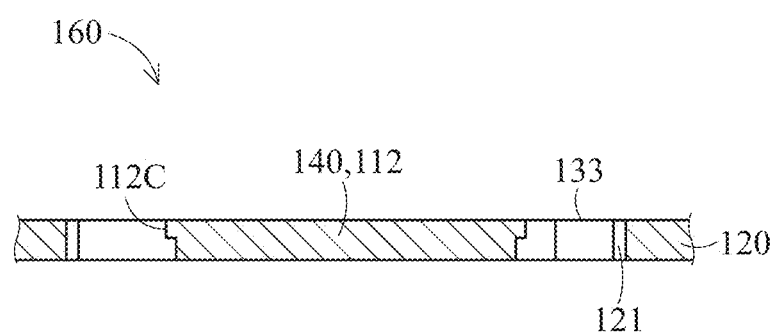

Referring to FIG. 13A to FIG. 13C, first a conductive sheet 160 is provided. The conductive sheet 160 comprises a frame body 120, and the frame body 120 comprises at least one supporting portion 121, at least one void area 130 and at least one extending portion 140. The at least one void area 130 may correspond to a gap 131, two first through grooves 132 and two second through grooves 133 of the carrier leadframe 100', but at this point, the two first through grooves 132 are not in communication with the two second through grooves 133 yet. The at least one extending portion 140 may correspond to the two electrode portions 112 of the carrier leadframe 100', but at this point, the two electrode portions 112 have not been separated from the frame body 120 yet.

Figure 14:
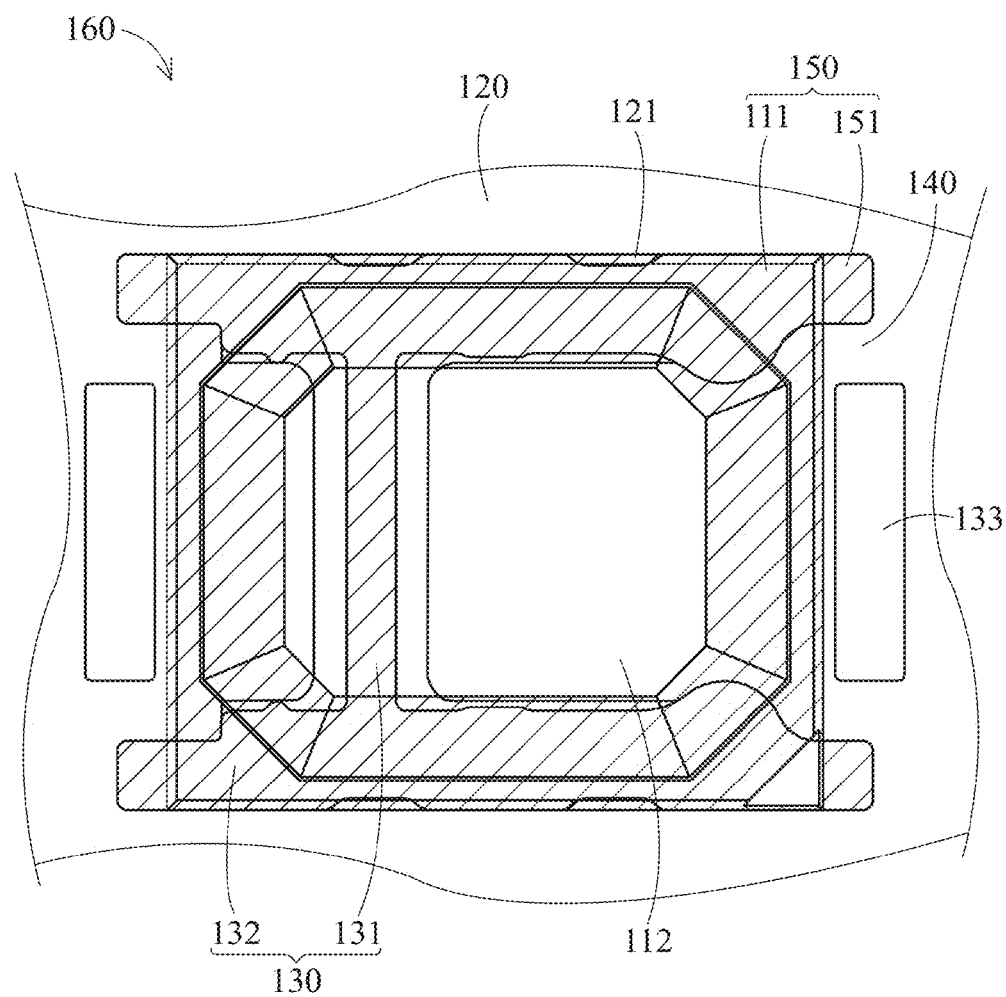

Referring to FIG. 14, then a plastic body 150 is formed in a second step. The plastic body 150 covers at least a part of the extending portion 140 and at least a part of the supporting portion 121, and the plastic body 150 fills at least a part of the void area 130. For example, the plastic body 150 covers a part of the two electrode portions 112 of the extending portion 140 and completely covers the supporting portion 121, and the plastic body 150 fills the gap 131 and the two first through grooves 132 of the void area 130 but does not fill the second through grooves 133 of the void area 130. Furthermore, the plastic body 150 may make contact with the recess 1121 (as shown in FIG. 13A) of the extending portion 140 so as to increase the contact area between the plastic body 150 and the extending portion 140.

Figure 15:
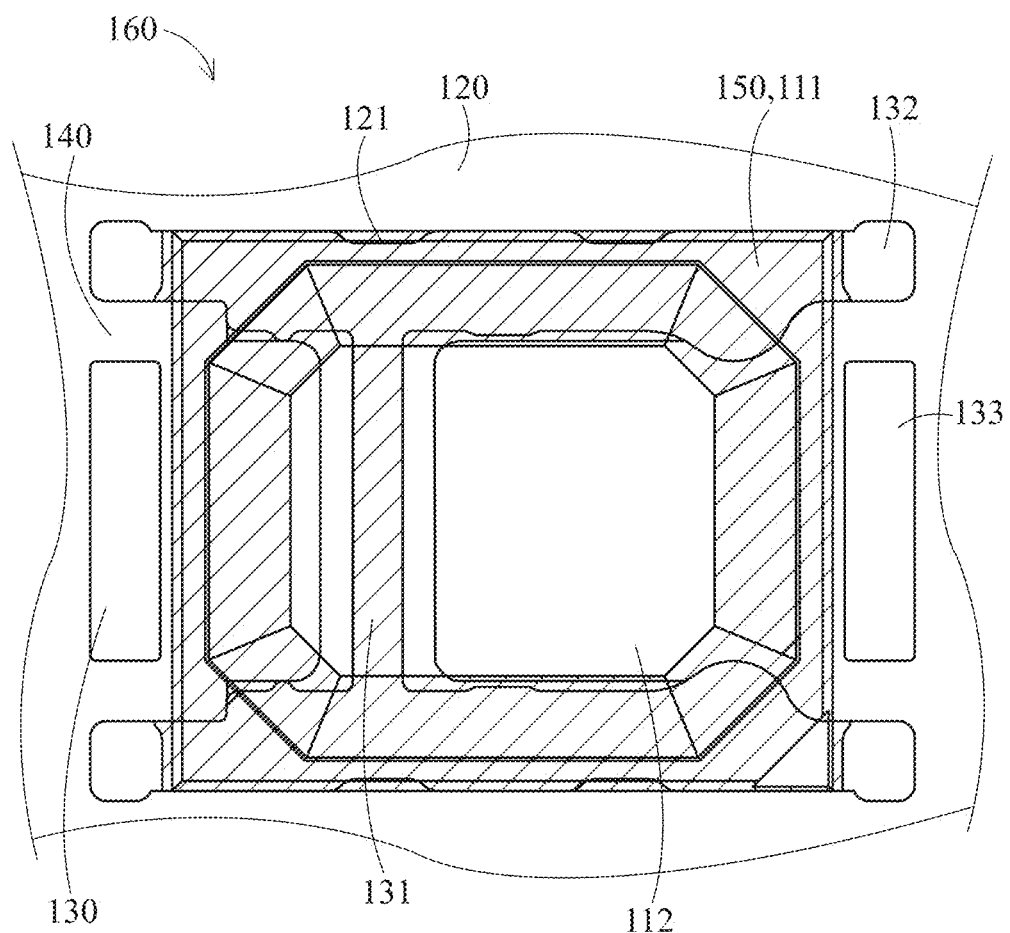

Referring to FIG. 15, part of the plastic body 150 filled in the void area 130 is removed in a third step. That is, part of the plastic body 150 filled in the two first through grooves 132 is removed. The plastic body 150 to be removed is called the residual material 151 (as shown in FIG. 14), and the scope of the residual material 151 is defined depending on the specific shape of the product. In this embodiment, the plastic body 150 filled in two end areas of the two first through grooves 132 is removed so that convex corners at four corners of the plastic body 150 are removed. The remaining plastic body 150 forms the housing 111 of the carrier leadframe 100'.

Figure 16:
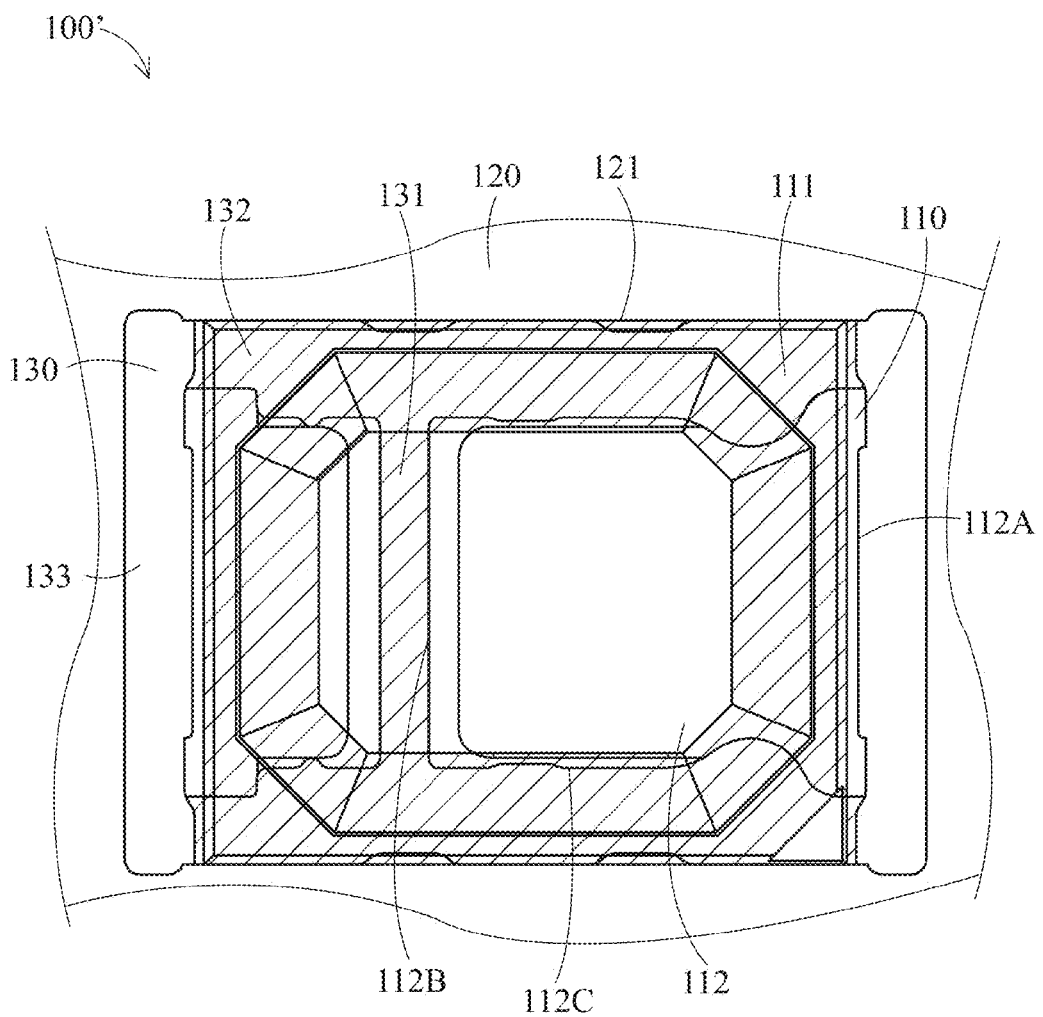

Referring to FIG. 16, the part of the extending portion 140 exposed outside the plastic body 150 is removed in a fourth step so that the remaining extending portion 140 is separated from the frame body 120. In other words, the part of the extending portion 140 at two sides of the second through groove 133 (as shown in FIG. 15) will be removed in this step so that the second through groove 133 is in communication with the first through groove 132. The remaining extending portion 140 forms the electrode portions 112 of the carrier leadframe 100'.

After the aforesaid steps, the carrier leadframe 100' is formed. For detailed technical contents of the aforesaid steps, reference may be made to the method for manufacturing the carrier leadframe 100. For example, a conductive layer may be firstly formed on the conductive sheet 160, the third step and the fourth step may be swapped with each other, and the plastic body 150 may be cleaned before the fourth step.

Referring to FIG. 17A to FIG. 17D, schematic views (i.e., a top view, a cross-sectional view taken along the front-to-back direction, a cross-sectional view taken along the left-to-right direction, and a partially enlarged view) of a carrier leadframe 100" according to an embodiment of the present disclosure are shown therein, where more than one carrier leadframe 100" are shown.

Figure 17A:
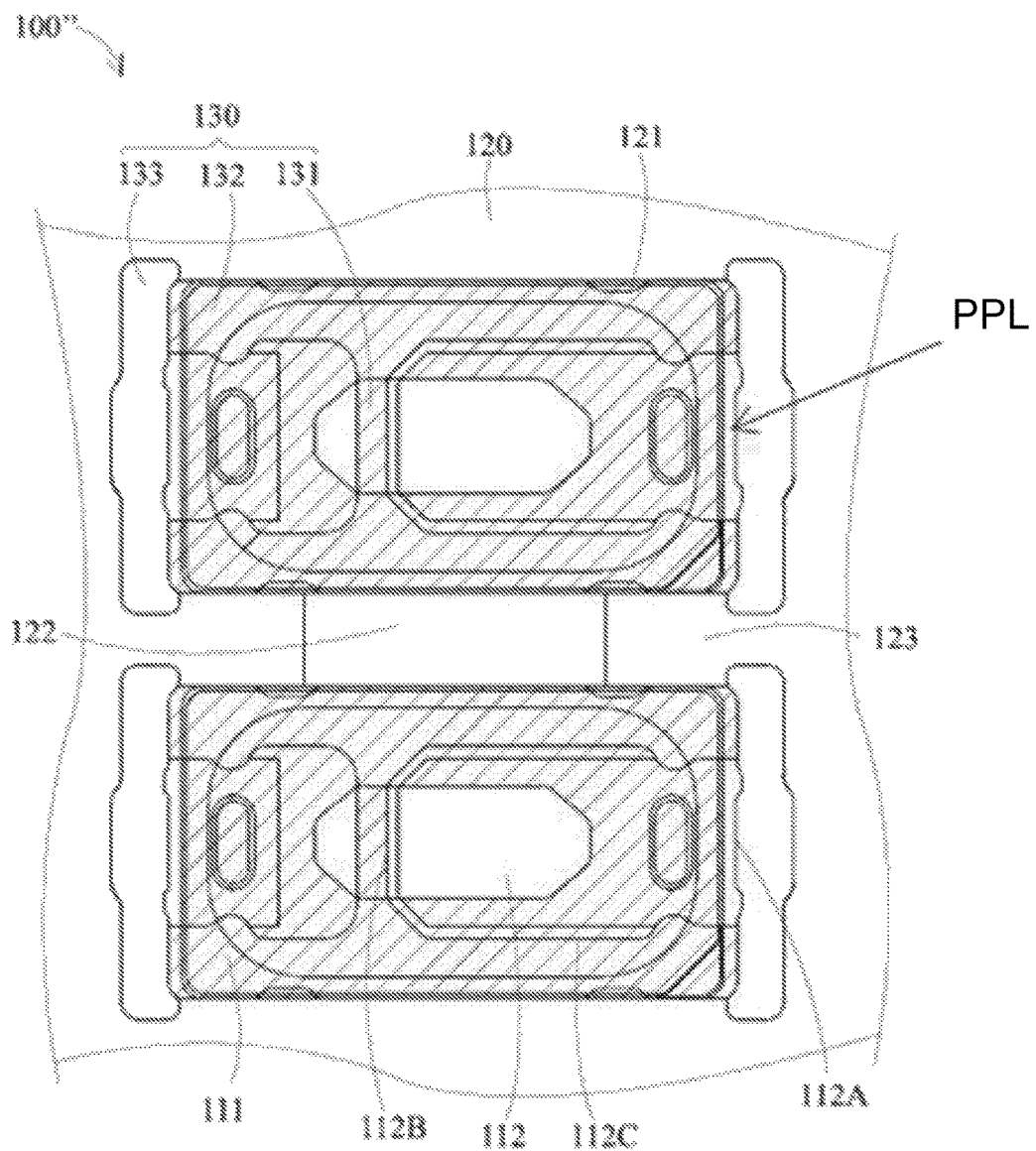
FIG. 17A to FIG. 17D are respectively a top view, a cross-sectional view taken along the front-to-back direction, a cross-sectional view taken along the left-to-right direction, and a partially enlarged view of a carrier leadframe according to an embodiment of the present disclosure.
Figure 17B:
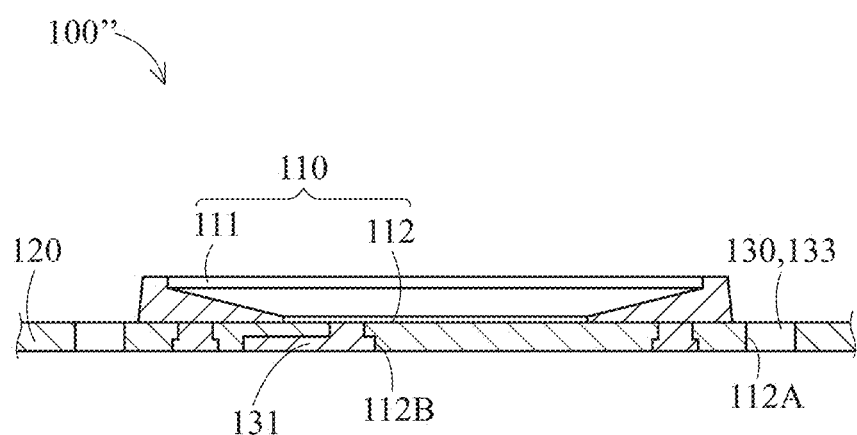
Figure 17C:
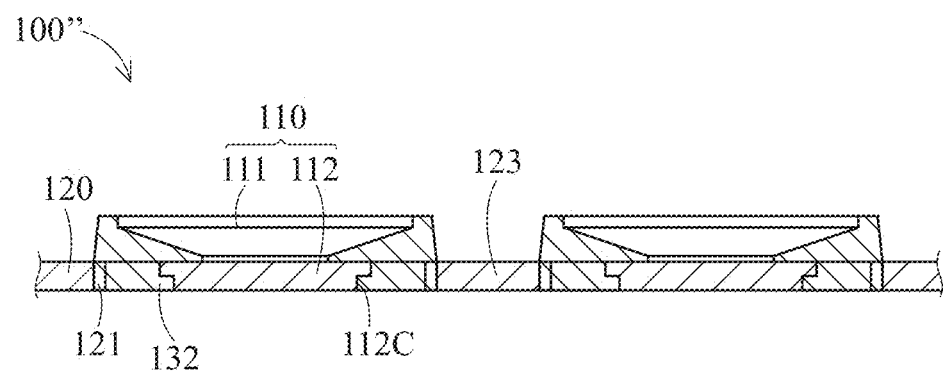
Figure 17D:
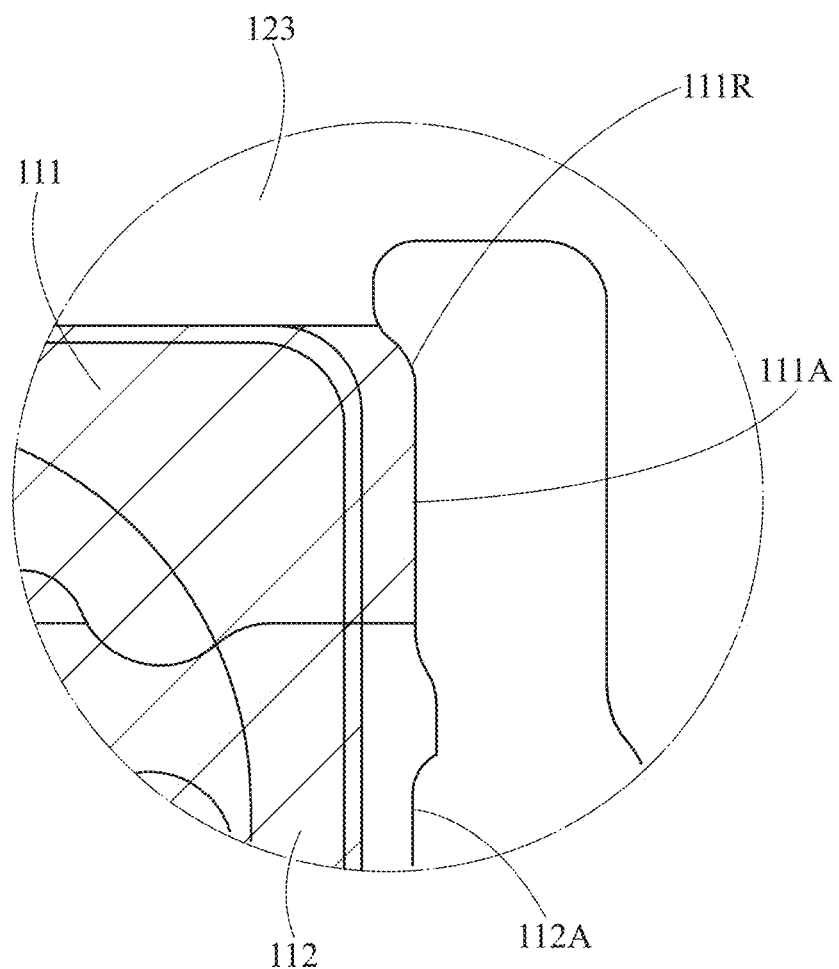

The carrier leadframe 100" is similar to the aforesaid carrier leadframes 100 and 100', so reference may be made to each other for the technical contents of the carrier leadframes 100", 100, and 100'. However, it shall be appreciated that, the frame body 120 of the carrier leadframe 100" has a side portion 123 and a runner area 122, and the side portion 123 may be commonly owned by the leadframes 120 of two carrier leadframes 100". In other words, the frame body 120 of the two carrier leadframes 100" may be formed integrally via the commonly owned side portion 123. Moreover, the carriers 110 of the two carrier leadframes 100" are separated from each other by the side portion 123. The runner area 122 is disposed in the side portion 123 and is in communication with one of the two first through grooves 132 of each carrier leadframe 100". It shall be further appreciated that, the housing cross section 111A of the housing 111 may at least comprise a curved surface, e.g., may have a rounded corner 111R, and the rounded corner 111R is connected to the side portion 123 of the frame body 120. Additionally, the electrode portion cross section of the electrode portion 112 may also at least comprise a curved surface, and the aforesaid curved surfaces are not limited to a single curvature. That is, the outline of the edge areas of the electrode portion 112 is a curved line. The electrode portion cross section 203 is not adjacent to the rounded corner 111R. The impact force can be dispersed due to the curved cross section. Meanwhile, in the embodiment as shown in FIG. 17D, the housing cross section and the electrode portion cross section 203 do not form a flat surface, i.e., the housing cross section is not level with the electrode portion cross section 203.

In terms of the effect, the carrier leadframe 100" can also allow the electrode portions 112 of the carriers 110 to be electrically isolated from each other. Thus, after the die bonding process, the wire bonding process and the encapsulation process are subsequently performed on the light emitting devices, the electric measurement can be directly performed on the light emitting devices that are not singulated, and this greatly improves the production speed of the light emitting devices.

An embodiment of the present disclosure further provides a method for manufacturing a carrier leadframe, which can at least manufacture the aforesaid carrier leadframe 100". The method for manufacturing the carrier leadframe 100" is similar to the method for manufacturing the carrier leadframe 100', so identical descriptions will be omitted or simplified. The method for manufacturing the carrier leadframe 100" may comprise the following steps.

Figure 18A:
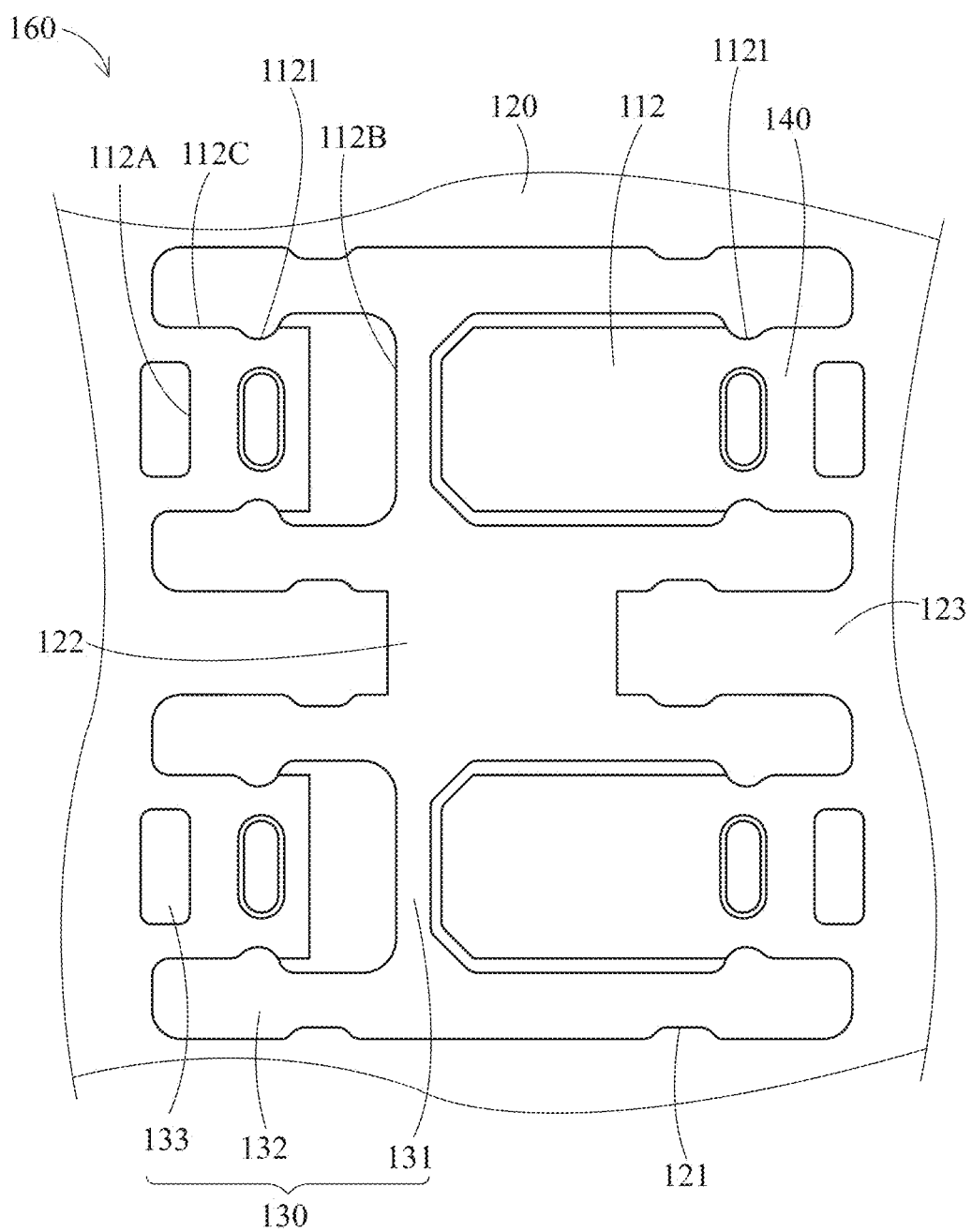
FIG. 18A to FIG. 22 are schematic views illustrating steps of a method for manufacturing a carrier leadframe according to an embodiment of the present disclosure.
Figure 18B:
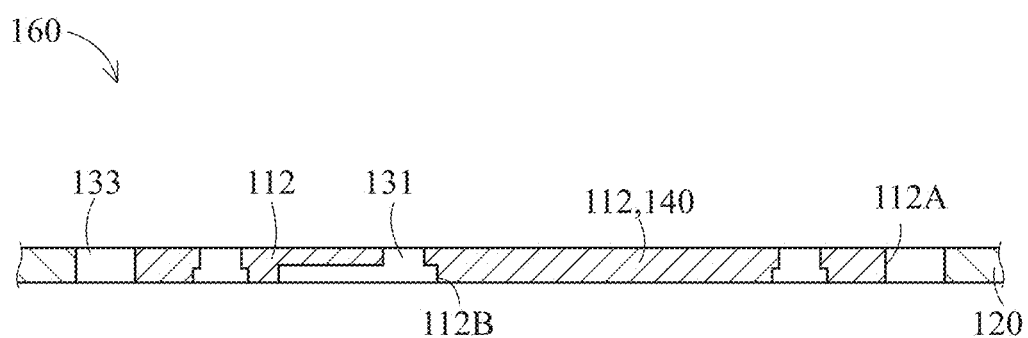
Figure 18C:
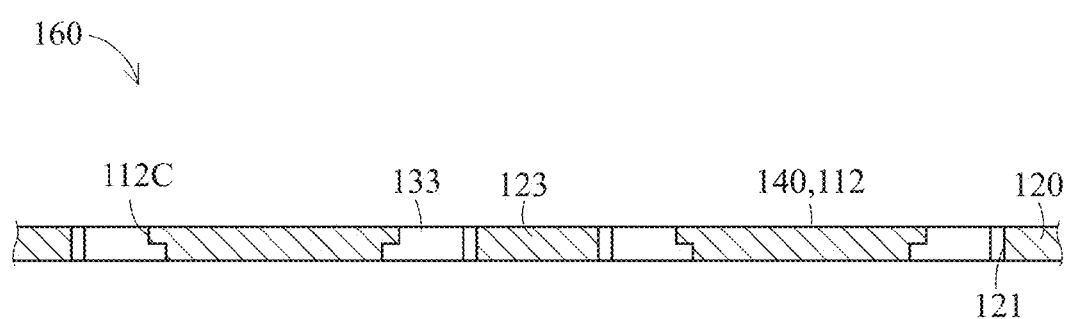

Referring to FIG. 18A to FIG. 18C, first a conductive sheet 160 is provided. Two conductive sheets 160 are provided in this embodiment as an example. Each of the conductive sheets 160 comprises at least one frame body 120, and the frame body 120 comprises at least one supporting portion 121, at least one side portion 123, at least one runner area 122, at least one void area 130 and at least one extending portion 140. The runner area 122 is disposed on the side portion 123 and is in communication with the void area 130.

Figure 19:
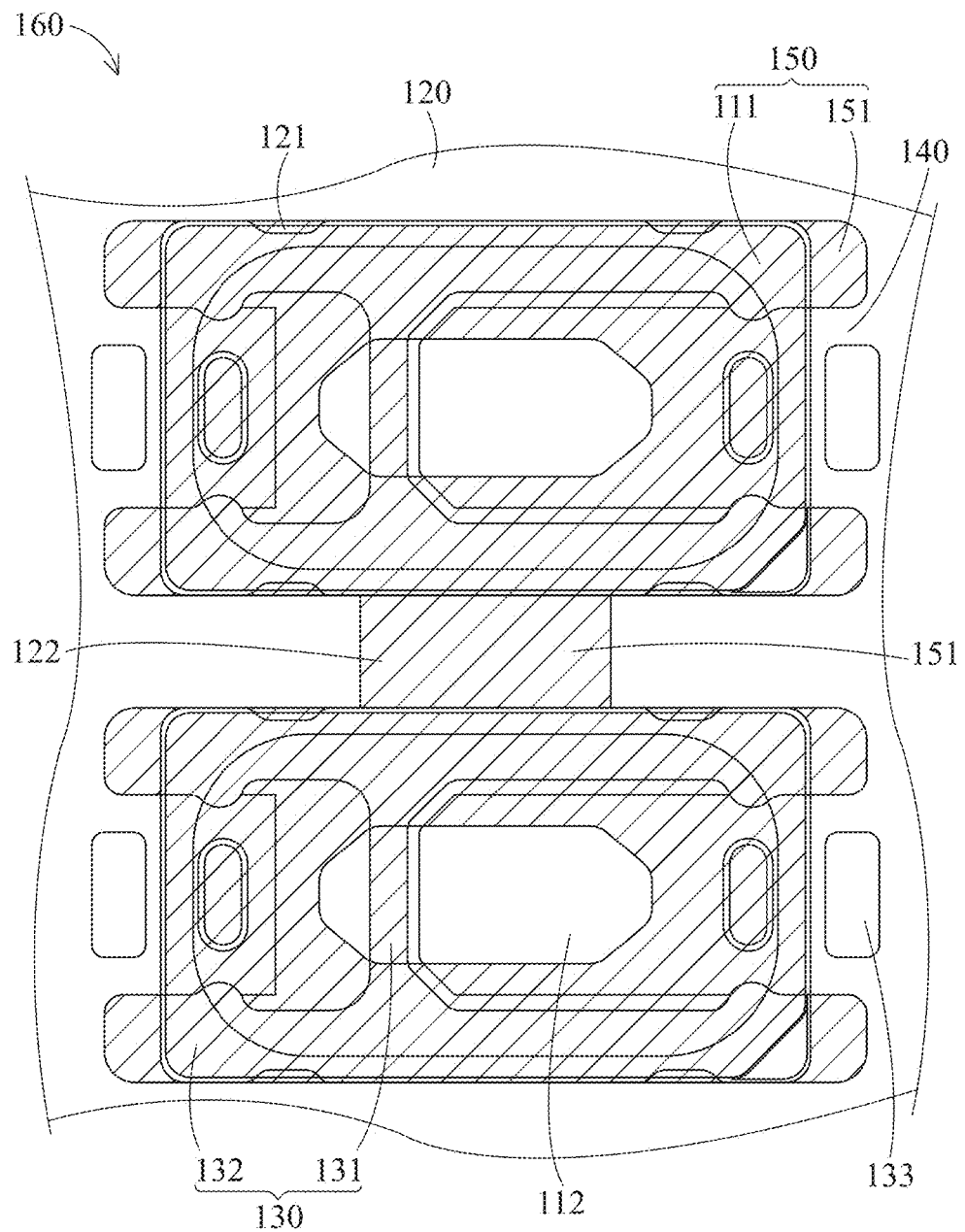

Referring to FIG. 19, then a plastic body 150 is formed in a second step. The plastic body 150 covers at least a part of the extending portion 140 and at least a part of the supporting portion 121 of each conductive sheet 160, and the plastic body 150 fills at least a part of the void area 130. The plastic body 150 also fills the runner area 122; that is, the plastic body 150 passes through the runner area 122 to cover another conductive sheet 160. Moreover, the plastic body 150 makes contact with the recess 1121 (as shown in FIG. 18A) of the extending portion 140 to increase the contact area between the plastic body 150 and the extending portion 140.

Figure 20:
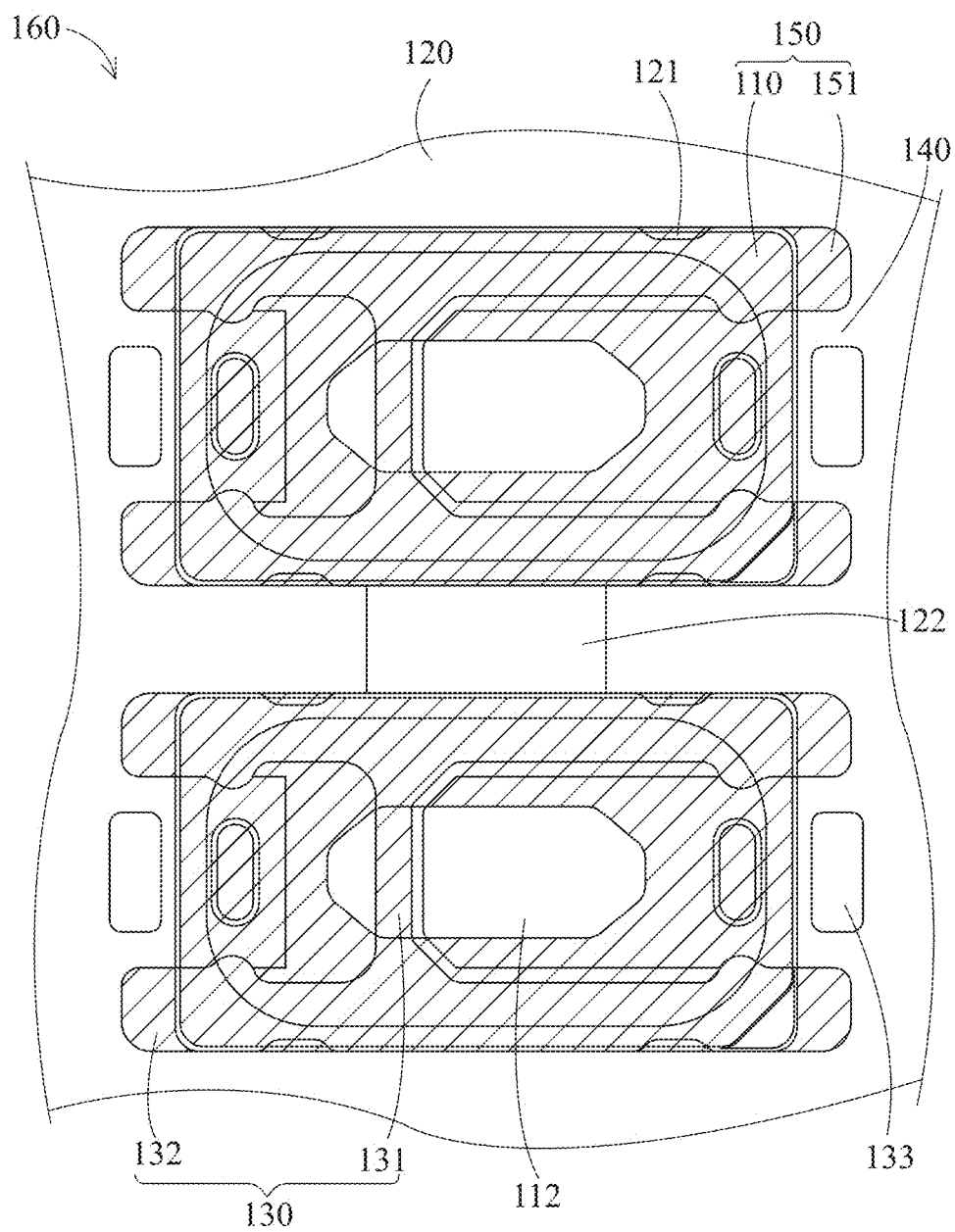

Referring to FIG. 20, the plastic body 150 within the runner area 122 is removed in a third step. The plastic body 150 can be removed in one step or in several steps. Specifically, if the plastic body 150 is to be removed in one step, then a knife of a length larger than that of the runner area 122 will be used to remove the part of the frame body 120 at the two sides of the runner area 122 as well as the plastic body 150 within the runner area 122 together. Thus, after the plastic body 150 within the runner area 122 is removed, the runner area 122 will be slightly elongated.

If the plastic body 150 is to be removed in several steps, then first a knife of a length slightly smaller than that of the runner area 122 will be used to remove part of the plastic body 150 within the runner area 122, and then another knife is used to scrape off the remaining plastic body 150 within the runner area 122.

Figure 21:
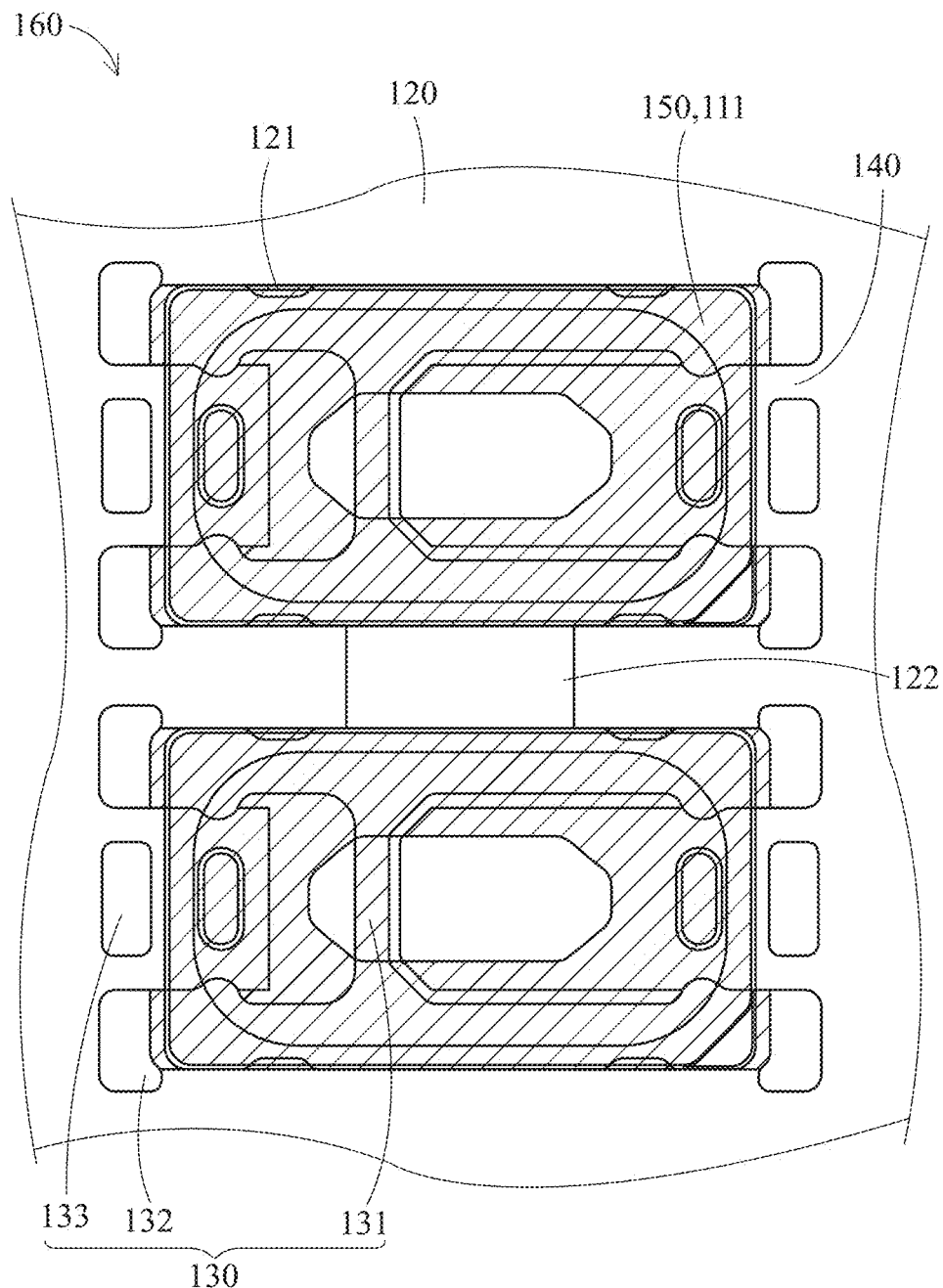

Referring to FIG. 21, part of the plastic body 150 filled within the void area 130 is removed in a fourth step. That is, part of the plastic body 150 filled within the two first through grooves 132 (e.g., the residual material 151 at the four corners as shown in FIG. 20) is removed. After the third and the fourth steps, the remaining plastic body 150 that is not removed forms the housing 111 of the carrier leadframe 100".

Figure 22:
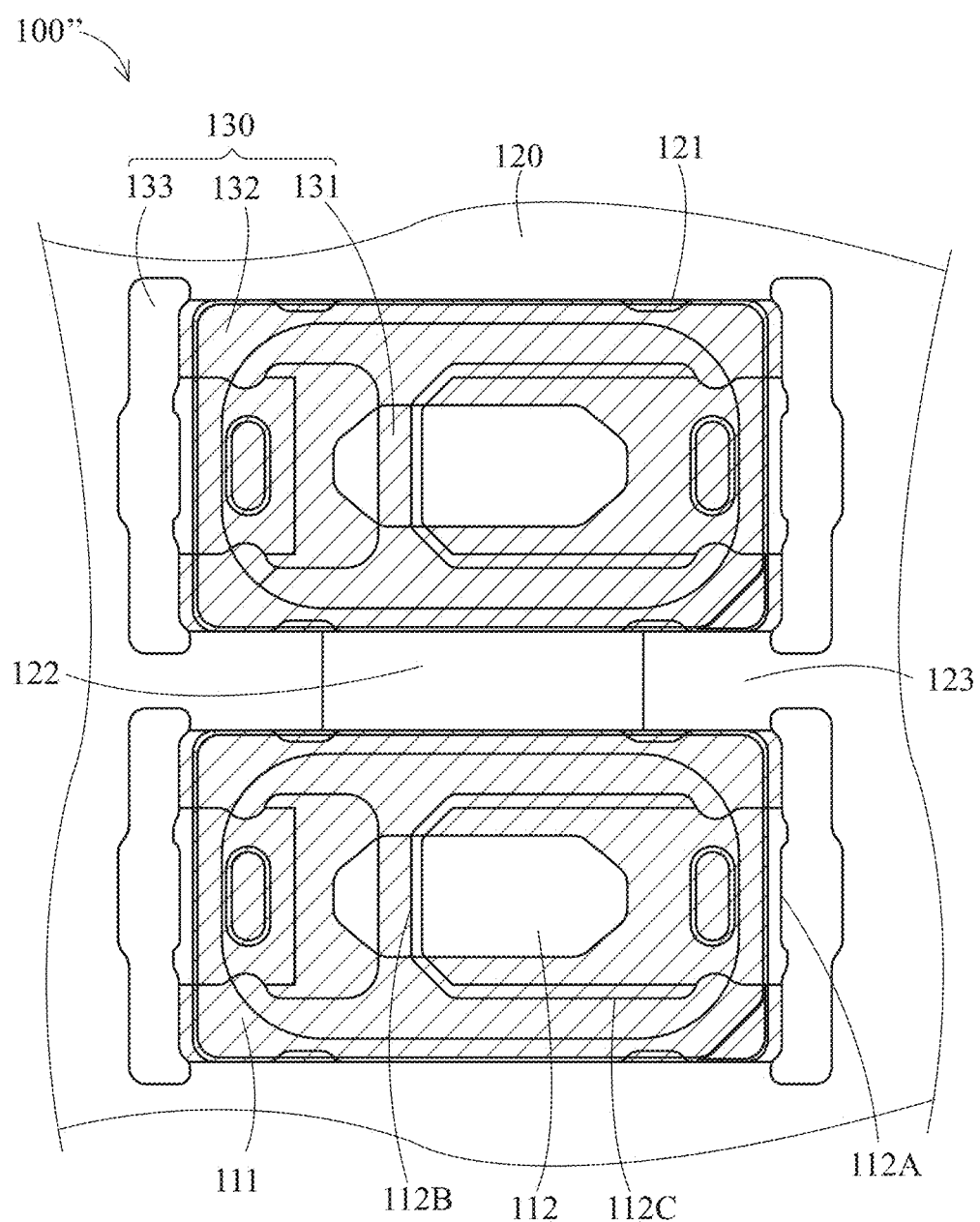

Referring to FIG. 22, the part of the extending portion 140 exposed outside the plastic body 150 (as shown in FIG. 21) is removed in a fifth step so that the remaining extending portion 140 is separated from the frame body 120. In other words, the part of the extending portion 140 at the two sides of the second through groove 133 will be removed in this step so that the second through groove 133 is in communication with the first through groove 132. The remaining extending portion 140 forms the electrode portions 112 of the carrier leadframe 100".

After the aforesaid steps, the carrier leadframe 100" is formed. It shall be noted that, the order in which the third step to the fifth step are executed is not limited, but can be swapped with each other.

FIG. 23 to FIG. 26B schematically shows the manufacturing process of the carrier leadframe of the present invention.

Figure 23:
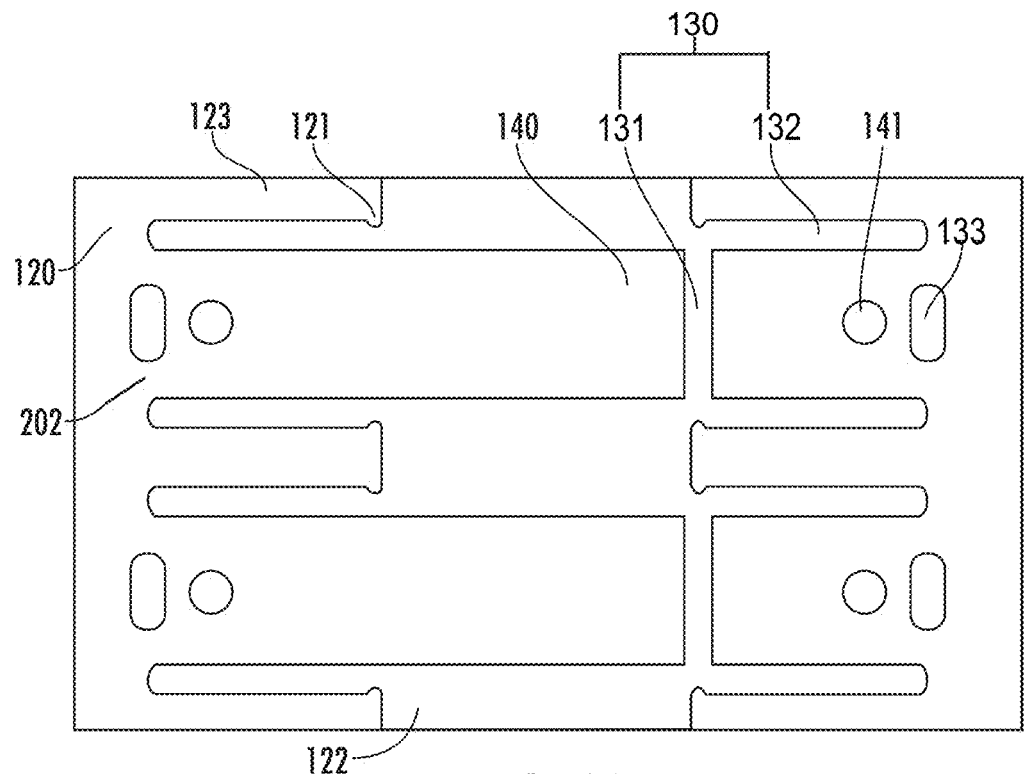
FIG. 23 to FIG. 26B are schematic views illustrating steps of a method for manufacturing a carrier leadframe according to an embodiment of the present disclosure.

First of all, a carrier leadframe as shown in FIG. 23 is provided. The carrier leadframe is a processed metal plate including a frame body 120 and a plurality of void areas 130. The frame body includes a plurality of extending portions 140, a plurality of side portions 123, supporting portions 121 and a plurality of tie bars 202. The void area may include a plurality of gaps 131, a plurality of running areas 122, and a plurality of grooves 132. More specifically, the carrier leadframe is a metal plate with a plurality of the void areas 130 formed by stamping or etching process. Preferably, the carrier leadframe is plated after the void area 130 is formed such that the top and bottom surface of the carrier leadframe and the side surface of the void area 130 are plated with a protective plating layer (PPL). The present invention does not have special limitations on the material of the metal sheet, although copper or aluminum is preferred. The protective plating layer (PPL) must be more resistant to oxidation than the metal sheet and is preferably silver or gold. The supporting portion 121 generally is placed at the side surface of the extending portion, A portion of the supporting portion 121 may extend toward to the extending portion 140 for increasing the binding force between resin and the frame body 120, however the supporting portion 120 would not contact with the extending portion 140. The extending portion 140 may connect with the frame body 120 through a plurality of tie bars 202. A plurality of tie bars 202 are generally disposed at one side end of the extending portion 140. For the present embodiment, there are two tie bars 202 are disposed at one of the extending portion 140. Moreover, in order to reduce the cutting region for the follow step, there would be a void area 130 between the two tie bars 202, therefore, the cutting speed may improve and reduce the cost for cutting step.

For the present embodiment, the different grooves 132 may connect with each other through the gap 131 and the runner area 122. However, the runner area 122 maybe placed depending on the molding process. If the transfer molding process is being selected, it may necessary to have the runner area between the different grooves 132.

Figure 24:
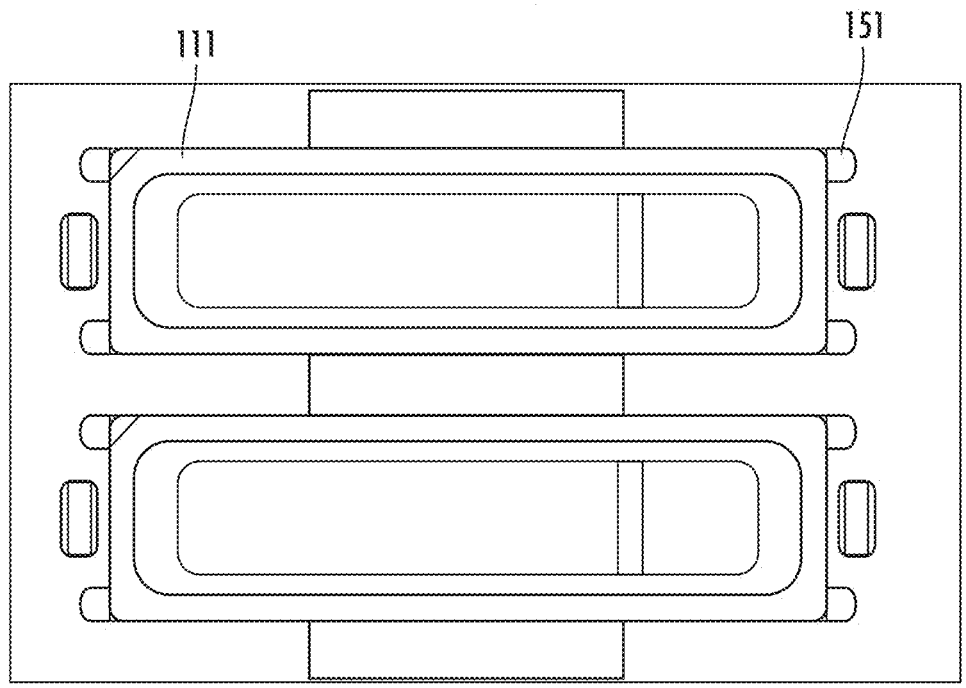

Following that, the carrier leadframe is then provided with a molded body by a molding process, as shown in FIG. 24. In this step, molding is carried out by holding the carrier leadframe within a mold with a plurality of blocks in order to form a plurality of carriers on the carrier leadframe. More specifically, a plastic material enters the plurality of grooves 132, a plurality of gaps 131 and a plurality of runner areas 122 by filling the cavities of the mold. The plastic material would be cured in further to form a plurality of carriers. Each of the carriers would comprise a housing 111 and a plurality of residual material 151, and the housing 111 would comprise a reflection concave cup on the portion of the extending portion 140. The housing portion 111 may partially covers a portion of the extending portions 140 and includes plastic body that extends through the corresponding locking holes 141 to reinforce connection between the housing portion 111 and the corresponding extending portions 140. Each housing portion 111 may also cover a portion of the supporting portions 121 so the housing portion 111 may be mechanically coupled to the corresponding supporting portions 121. In the subsequent stamping process, each housing portion 111 is supported by the corresponding supporting portions 140 and is thus temporarily fixed to the frame body.

Figure 25:
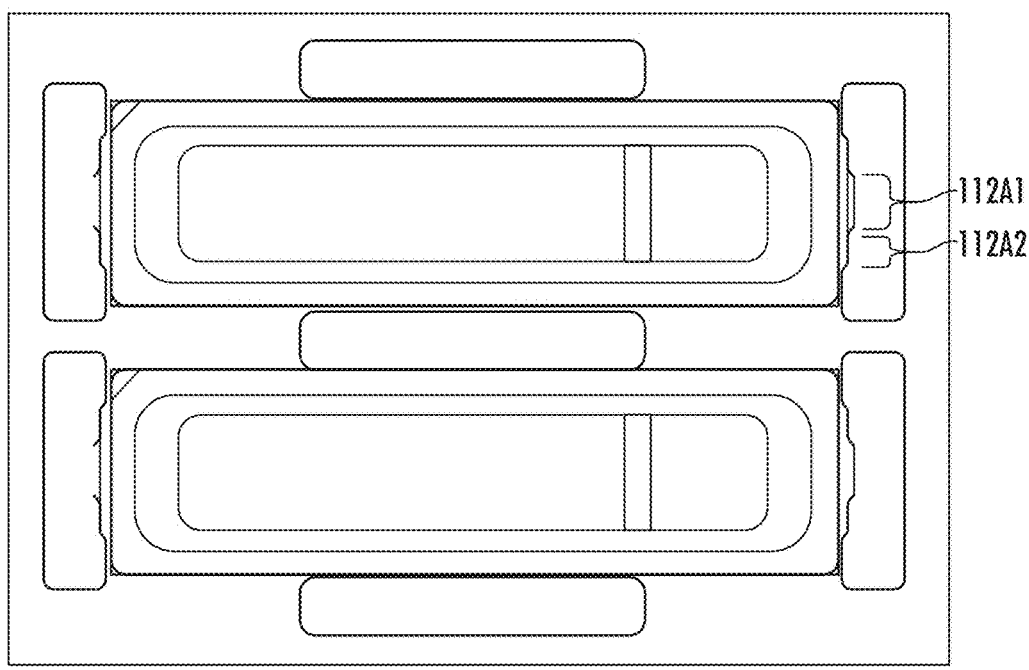

Then, the molded body of this embodiment is cut by a stamp process as shown in FIG. 25. In this step, a portion of the residual material 151 and a portion of tie bar 202 are removed by one or multiple stamping operations, with a view to forming several separated carriers. If only one stamping operation is used, a portion of the residual material 151 and a portion of tie bar 202 will be removed at the same time. If multiple stamping operations are used, it is preferable that a portion of the residual material 151 is removed in advance, and then followed by the a portion of tie bar 202 would be removed, and separates from the frame body in the final. The separated carrier would be still temporarily fixed to the frame body 120 by the supporting portions 121 such that a carrier leadframe with a plurality of separated carriers is formed. More specifically, the cut surface of the residual material and the cut surface of the tie bar would result a curved structure at the cut surface of the tie bar or a multi-step surface as detailed further below. For the other stamping process is similar as the stamping process involving in the present exemplary embodiment shown in FIGS. 1 to 5.

Figure 26A:
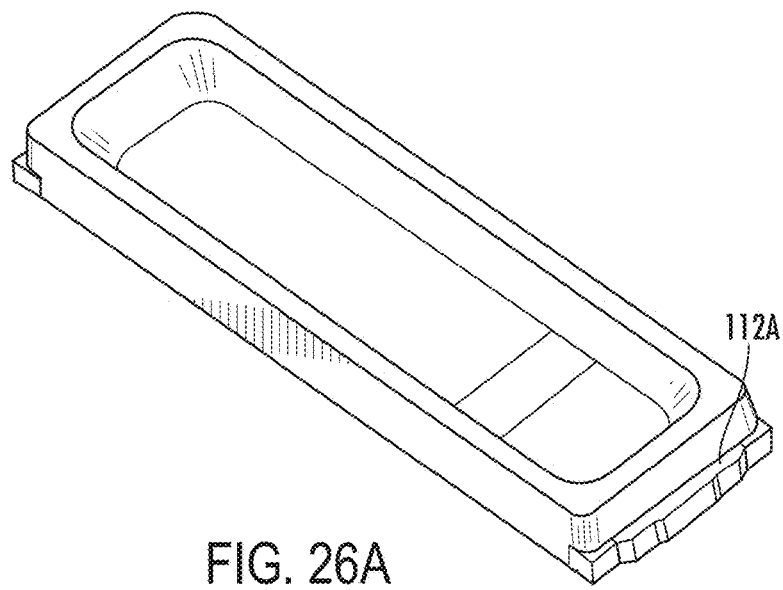
Figure 26B:
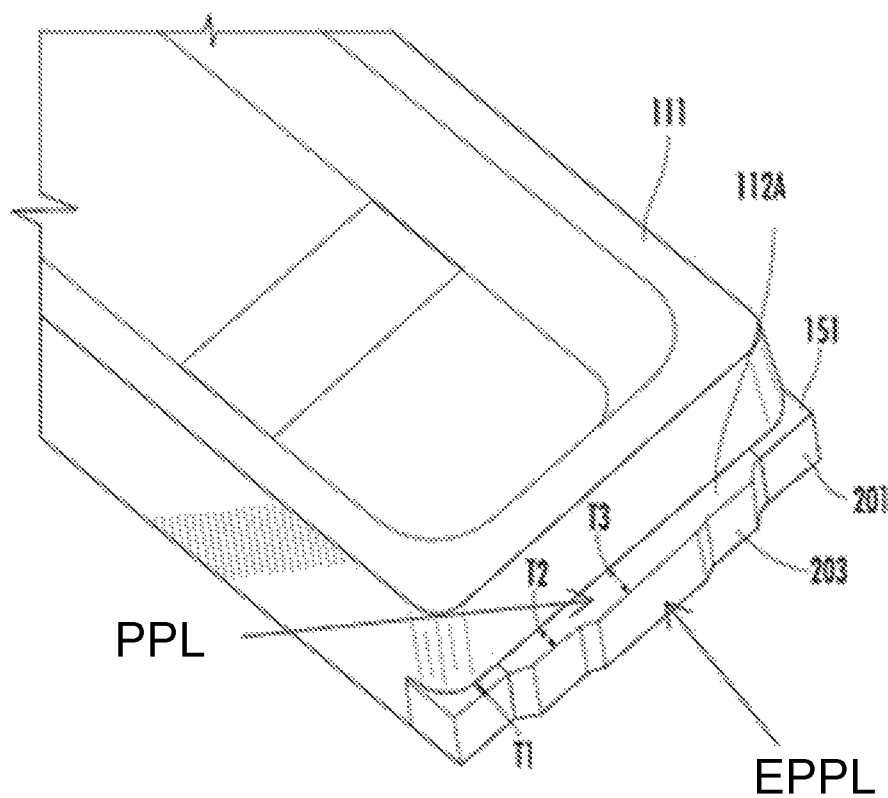

After stamping process, a carrier leadframe with a plurality of separated carriers is formed. The plurality of separated carriers can be detached from the carrier leadframe as a single carrier by pushing them with an external force. FIG. 26A is a perspective view of a carrier thus obtained, and FIG. 26B is an enlarged view of the dashed-line encircled area in FIG. 26A. As shown in FIG. 26B, the housing has a lateral side provided with a residual material 151 projected from the concave reflecting cup of housing, wherein the residual material 151 has a width T1 for the top surface of the residual material 151. FIG. 26B also shows an electrode portion with a wing portion 112A protruding beyond the housing, wherein the wing portion 112A is further divided into a central area 112A1 and two edge areas 112A2 which would be located at the two end side of the central area. The top surface of the central region 112A1 and the edge area 112A2 comprise a width as T2 and T3 accordingly. In the present invention, the relationship between T1, T2, and T3 is (T1<T2<T3). Preferably, T3 is at least 1.2 times as large as T2, and T2 is 1.2 times as large as T1. Besides, the difference between T2 and T3 is preferably greater than that between T1 and T2, namely (T2−T1)>(T1−T2). The lateral side of the central area 112A1 used to be the wall surface of a lateral through hole and therefore has a protective plating layer (PPL). The edge areas 112A2, on the other hand, are where tie bars 202 are cut and therefore each have an electrode portion cross section 203, in which the material of the metal sheet, e.g., copper, is completely exposed. The electrode portion cross section 203 of each edge areas 112A2 has a smaller area than the outer side surface of central area 112A1. As the exposed metal portions may result the reliability issue when the separated carrier connects to a PCB, therefore an external plating layer EPPL is provided for protection. Preferably, if the external plating layer EPPL is used for protection, the external plating layer EPPL would cover the electrode portion cross section 203 entirely. If it is impossible for the external plating layer EPPL to cover the electrode portion cross section 203 entirely, the external plating layer EPPL should at least cover the upper region of the electrode portion cross section 203 so that, when the separated carrier is connected to the PCB, the lower region of the electrode portion cross section 203 can be isolated from the environment by soldering material while the upper region of the electrode portion cross section 203 can be protected by the external plating layer EPPL.

When forming the aforesaid plating layers, the thickness of the external plating layer EPPL is not required to be the same as the protective plating layer (PPL). Normally, the protective plating layer (PPL) is thicker than the external plating layer. Moreover, the external plating layer (EPPL) can be formed by barrel plating, or the protective plating layer (PPL) can extend downward through the cutting operation so as to cover the electrode portion cross section 203 partially. Preferably, the extended protective plating layer (PPL) covers the electrode portion cross section 203 in their entirely. Referring again to FIG. 26B, the residual material has a resin cross section 201, and the resin cross section area 201 is preferably smaller than the outer side surface of the wing portion 112A. Preferably, the resin cross section 201 forms a rough surface after the cutting operation. An additional plating layer may be further formed on the lateral side of the carrier to protect the electrode portion cross section 203. Apart from that, the resin cross section 201 and the outer side surface of the reflective wall are preferably to be substantial coplanar in order to increase the area of the outer side surface of the electrode for soldering material.

The above description is related to the detailed technical contents and inventive features thereof. People skilled in this field may proceed with a variety of modifications and replacements based on the description and suggestions of the present disclosure as described without departing from the characteristics thereof. Nevertheless, although such modifications and replacements are not fully disclosed in the above descriptions, they have substantially been covered in the following claims as appended.

What is claimed is:
1. A light emitting device comprising:
   a light emitting chip;
   at least one electrode portion, an entirety of each of a top surface and a bottom surface of the at least one electrode portion being covered by a protective plating layer; and
   a resin housing containing a reflecting material;
   wherein said at least one electrode portion with the protective plating layer is partially covered by the resin housing,
   wherein said at least one electrode portion further comprises a wing portion protruding from the resin housing to be exposed, at least a portion of said wing portion, which is void of the protective plating layer, including an external protective plating layer, lateral sides of the resin housing being provided with a residual resin material projected from a concave reflecting cup of the resin housing, top and bottom surfaces of the residual resin material and the wing portion being coplanar, and wherein a first thickness of the protective plating layer and a second thickness of the external protective plating layer is not the same.

2. The light emitting device according to claim 1, wherein the second thickness of the external protective plating layer is not uniform.

3. The light emitting device according to claim 2, wherein the wing portion further comprises a central area and at least one edge area.

4. The light emitting device according to claim 3, wherein the at least one edge area protrudes from the central area.

5. The light emitting device according to claim 4, wherein an outer side surface of the central area is covered by the external protective plating layer.

6. The light emitting device according to claim 5, wherein the edge area comprises an electrode portion cross section.

7. The light emitting device according to claim 6, wherein the electrode portion cross section is covered by the external protective plating layer.

8. The light emitting device according to claim 1, wherein the second thickness of the external protective plating layer of the central area is thicker than the second thickness of the external protective plating layer of the electrode portion cross section.

9. The light emitting device according to claim 8, wherein the external protective plating layer of the electrode portion cross section extends from the protective plating layer.

10. The light emitting device according to claim 9, wherein upper region of the electrode portion cross section is covered by the external protective plating layer.

11. The light emitting device according to claim 10, wherein the electrode portion cross section comprises a curved surface.

12. The light emitting device according to claim 11, wherein a housing cross section is located in the vicinity of a corner of the resin housing.

13. The light emitting device according to claim 12, wherein the resin housing further comprises at least one housing cross section.

14. The light emitting device according to claim 13, wherein the housing cross section is located in the vicinity of four corners of the resin housing.

15. The light emitting device according to claim 14, wherein the housing cross section is not level with the electrode portion cross section.

16. A light emitting device comprising:
a light emitting chip;
a resin housing containing a reflecting material; and
at least one electrode portion covered by a protective plating layer entirely on a top surface of the at least one electrode portion and entirely on a bottom surface of the at least one electrode portion, wherein said at least one electrode portion with the protective plating layer is partially covered by the resin housing,
wherein said at least one electrode portion further comprises a wing portion protruding from the resin housing to be exposed,
wherein lateral sides of the resin housing are provided with a residual resin material projected from a concave reflecting cup of the resin housing,
wherein top and bottom surfaces of the residual resin material and the wing portion are coplanar,
wherein said at least one electrode portion comprises an electrode portion cross section not including the protective plating layer, the electrode portion cross section being covered by an external protective plating layer,
wherein said the external protective plating layer extends from the protective plating layer, and wherein a first thickness of the protective plating layer is thicker than a second thickness of the external protective plating layer.

17. The light emitting device according to claim 16, wherein the housing cross section is located in the vicinity of the corner of the resin housing.

18. The light emitting device according to claim 17, wherein the external protective plating layer covers an upper region of the electrode portion cross section.

* * * * *